United States Patent
More et al.

(10) Patent No.: US 11,908,915 B2
(45) Date of Patent: *Feb. 20, 2024

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Shahaji B. More, Hsinchu (TW); Chandrashekhar Prakash Savant, Hsinchu (TW); Tien-Wei Yu, Kaohsiung (TW); Chia-Ming Tsai, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/751,328

(22) Filed: May 23, 2022

(65) Prior Publication Data

US 2022/0285517 A1     Sep. 8, 2022

Related U.S. Application Data

(63) Continuation of application No. 16/888,548, filed on May 29, 2020, now Pat. No. 11,342,434.

(51) Int. Cl.
*H01L 29/49* (2006.01)
*H01L 21/28* (2006.01)
(Continued)

(52) U.S. Cl.
CPC .... *H01L 29/4966* (2013.01); *H01L 21/28088* (2013.01); *H01L 27/0924* (2013.01); *H01L 29/42372* (2013.01)

(58) Field of Classification Search
CPC .......... H01L 29/4966; H01L 29/42372; H01L 21/28088; H01L 27/0924
See application file for complete search history.

(56) References Cited

U.S. PATENT DOCUMENTS

| 7,727,882 B1 | 6/2010 | Wu et al. |
| 9,837,507 B1 | 12/2017 | Wang et al. |

(Continued)

FOREIGN PATENT DOCUMENTS

| CN | 106158932 A | 11/2016 |
| CN | 107887428 A | 4/2018 |

(Continued)

OTHER PUBLICATIONS

Non-Final Office Action issued in U.S. Appl. No. 16/888,548 dated Apr. 13, 2021.

(Continued)

*Primary Examiner* — Christine A Enad
(74) *Attorney, Agent, or Firm* — STUDEBAKER & BRACKETT, PC

(57) ABSTRACT

A semiconductor device includes a gate structure disposed over a channel region and a source/drain region. The gate structure includes a gate dielectric layer over the channel region, one or more work function adjustment material layers over the gate dielectric layer, and a metal gate electrode layer over the one or more work function adjustment material layers. The one or more work function adjustment layers includes an aluminum containing layer, and a diffusion barrier layer is disposed at at least one of a bottom portion and a top portion of the aluminum containing layer. The diffusion barrier layer is one or more of a Ti-rich layer, a Ti-doped layer, a Ta-rich layer, a Ta-doped layer and a Si-doped layer.

20 Claims, 15 Drawing Sheets

(51) Int. Cl.
*H01L 27/092* (2006.01)
*H01L 29/423* (2006.01)

(56) References Cited

U.S. PATENT DOCUMENTS

| | | | |
|---|---|---|---|
| 10,249,488 | B1 | 4/2019 | Hsu et al. |
| 10,741,401 | B1 | 8/2020 | Xu et al. |
| 10,892,342 | B2 | 1/2021 | Chung et al. |
| 11,342,434 | B2 * | 5/2022 | More ................ H01L 29/66795 |
| 2012/0012937 | A1 | 1/2012 | Chew et al. |
| 2013/0026578 | A1 | 1/2013 | Tsau |
| 2013/0056833 | A1 | 3/2013 | Takeoka |
| 2014/0167187 | A1 | 6/2014 | Kuo et al. |
| 2014/0363960 | A1 | 12/2014 | Kim et al. |
| 2015/0014780 | A1 | 1/2015 | Kim et al. |
| 2015/0262823 | A1 | 9/2015 | Hung et al. |
| 2016/0380066 | A1 * | 12/2016 | Lin .................. H01L 21/28568 438/591 |
| 2017/0117191 | A1 | 4/2017 | Zhou |
| 2018/0108745 | A1 * | 4/2018 | Li ..................... H01L 21/28088 |
| 2019/0081148 | A1 | 3/2019 | Chung et al. |
| 2019/0371674 | A1 * | 12/2019 | Wu ................... H01L 21/82385 |
| 2020/0105894 | A1 * | 4/2020 | Wang ............. H01L 21/823431 |

FOREIGN PATENT DOCUMENTS

| | | |
|---|---|---|
| CN | 107958872 A | 4/2018 |
| CN | 109473473 A | 3/2019 |
| KR | 10-2013-0014299 | 2/2013 |
| KR | 10-2014-0142957 | 12/2014 |
| KR | 10-2017-0002261 | 1/2017 |

OTHER PUBLICATIONS

Final Office Action issued in U.S. Appl. No. 16/888,548 dated Nov. 3, 2021.

Notice of Allowance issued in U.S. Appl. No. 16/888,548 dated Jan. 24, 2022.

* cited by examiner

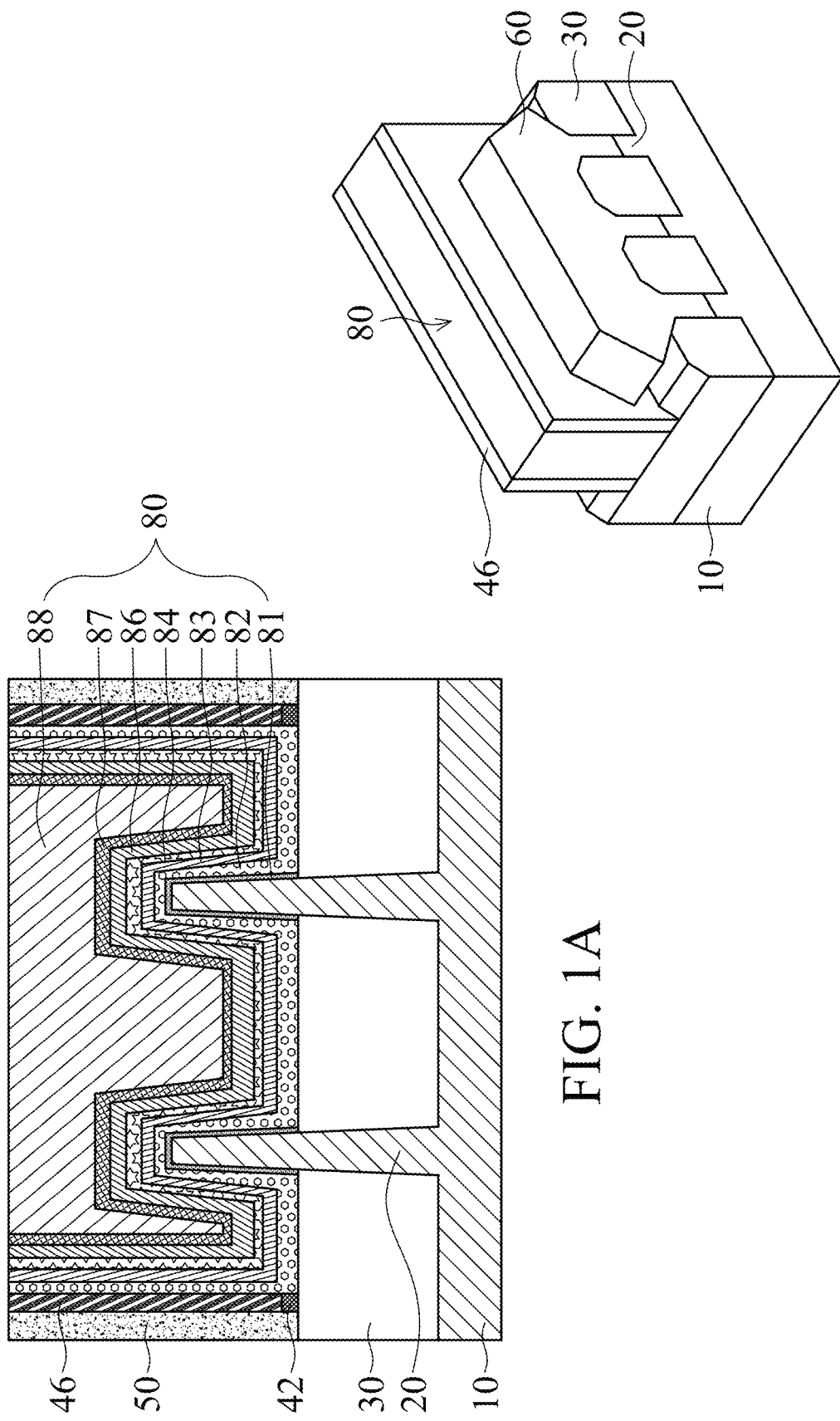

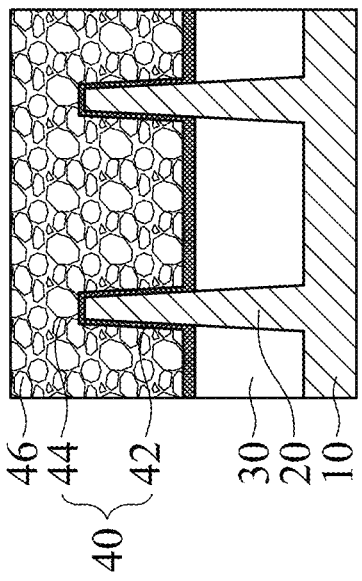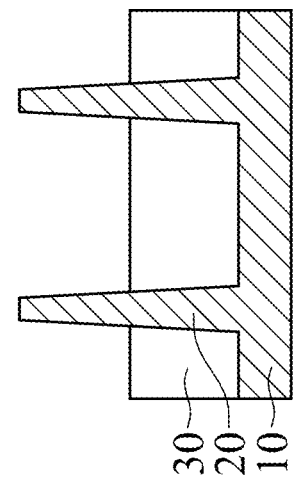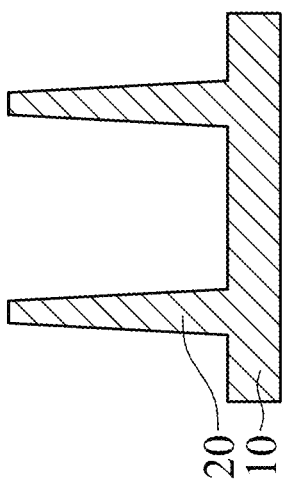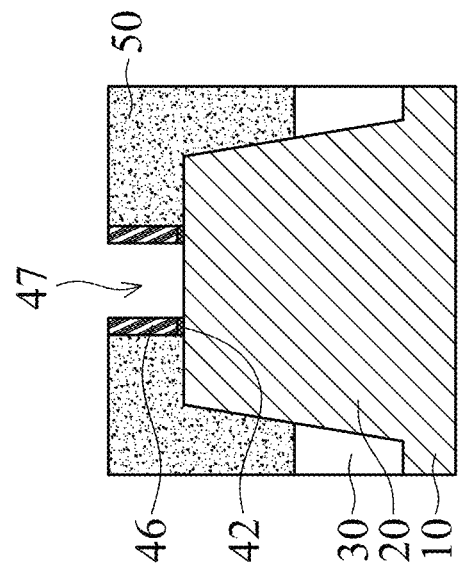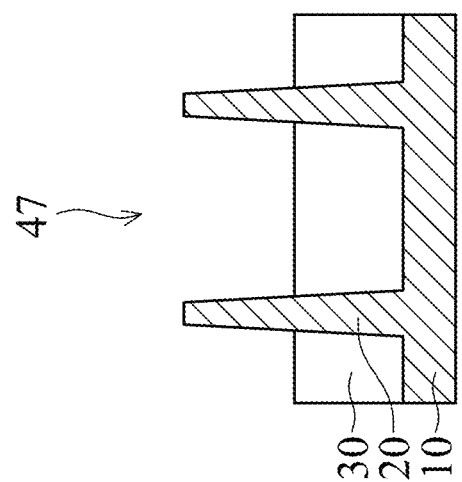

| | U-Low voltage | Low voltage | Standard voltage |
|---|---|---|---|
| NFET (Si Channel) | WF1 | WF2 | WF3 |
| PFET (SiGe Channel) | WF3 | WF2 | WF1 |

|      | Vt1 | Vt2 | Vt3 | Vt4 | Vt5 | Vt6 | Vt7 | Vt8 |
|------|-----|-----|-----|-----|-----|-----|-----|-----|
| NFET | WF1 HK2 | WF1 HK3 | WF2 HK1 | WF2 HK2 | WF2 HK3 | WF3 HK1 | WF3 HK2 | WF3 HK3 |
| PFET | WF3 HK3 | WF3 HK2 | WF3 HK1 | WF2 HK3 | WF2 HK2 | WF2 HK1 | WF1 HK3 | WF1 HK2 |

|Vt1| < |Vt2| < |Vt3| < |Vt4| < |Vt5| < |Vt6| < |Vt7| < |Vt8|

FIG. 4C

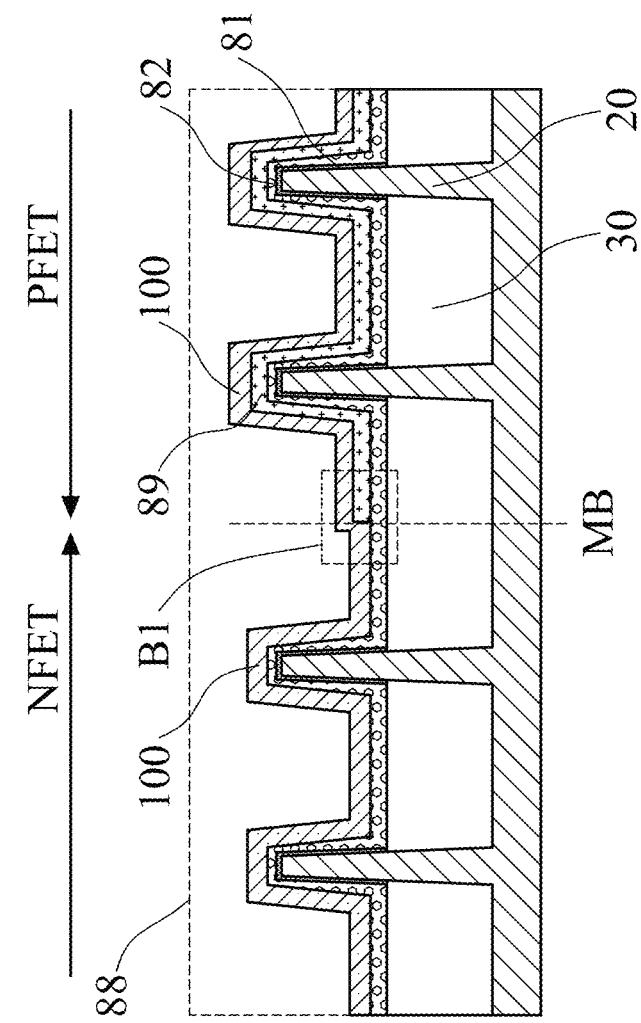
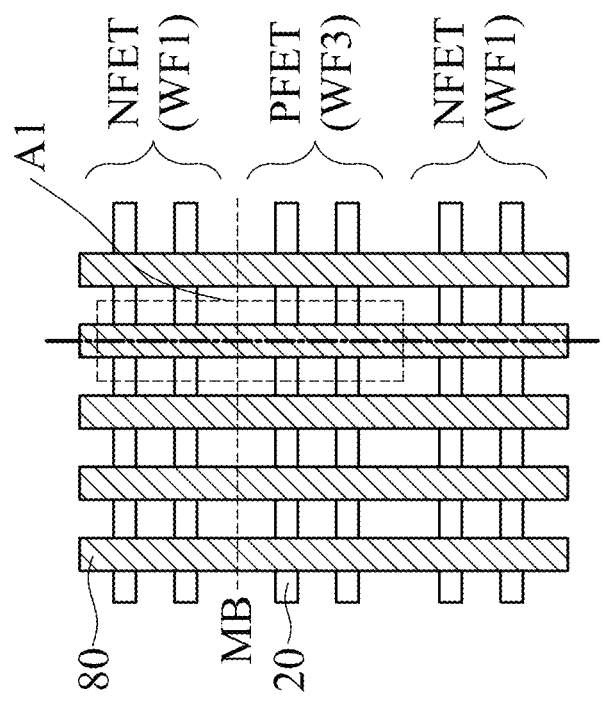
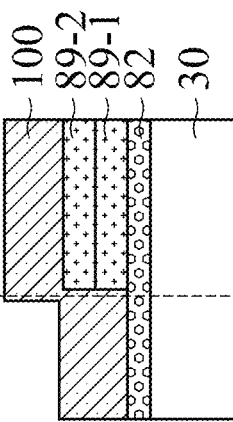
FIG. 5A
FIG. 5B
FIG. 5C

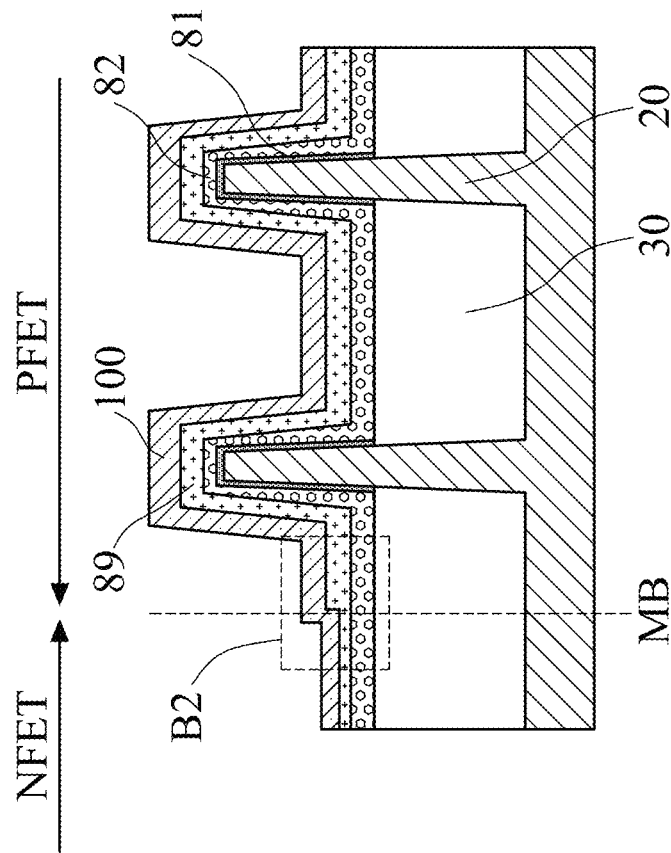
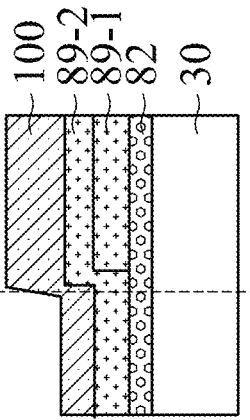
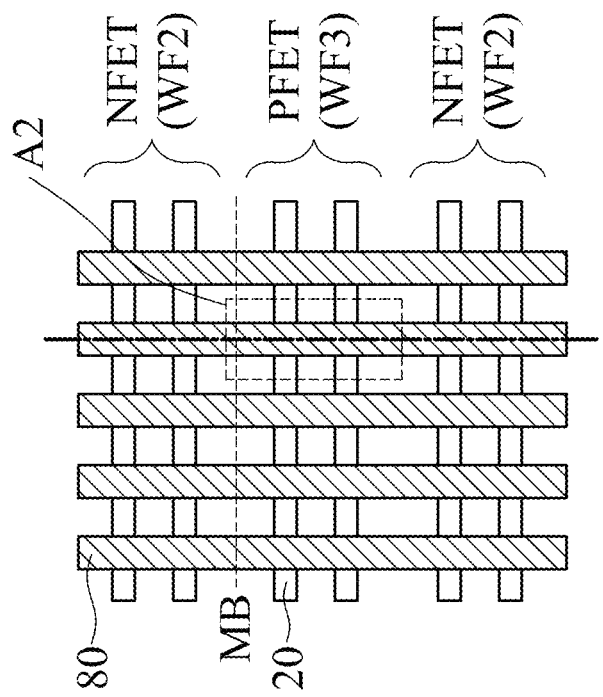
FIG. 6B
FIG. 6C
FIG. 6A

METHOD OF MANUFACTURING SEMICONDUCTOR DEVICES AND SEMICONDUCTOR DEVICES

RELATED APPLICATIONS

This application is a continuation of U.S. patent application Ser. No. 16/888,548 filed on May 29, 2020, now U.S. Pat. No. 11,342,434, the entire content of which is incorporated herein by reference.

BACKGROUND

With increasing down-scaling of integrated circuits and increasingly demanding requirements of speed of integrated circuits, transistors need to have higher drive currents with increasingly smaller dimensions. Three dimensional field-Effect Transistors (FETs) were thus developed. Three dimensional (3D) FETs include vertical semiconductor nanostructures (such as fins, nanowires, nanosheets etc.) above a substrate. The semiconductor nanostructures are used to form source and drain regions, and channel regions between the source and drain regions. Shallow Trench Isolation (STI) regions are formed to define the semiconductor nanostructures. The 3D FETs also include gate stacks, which are formed on the sidewalls and the top surfaces of the semiconductor fins or on the all sides of nanowires, nanosheets. Since 3D FETs have a three-dimensional channel structure, ion implantation processes to the channel require extra care to reduce any geometrical effects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows a cross section view and FIG. 1B shows a perspective view of a semiconductor device according to an embodiment of the present disclosure.

FIGS. 2A, 2B, 2C, 2D, 2E and 2F show cross sectional views of various stages of a sequential manufacturing process of a semiconductor device according to an embodiment of the present disclosure.

FIG. 4A shows gate structures of multiple FETs with different threshold voltages according to embodiments of the present disclosure. FIGS. 4B and 4C show various work function adjustment material layers and high-k gate dielectric layers for multiple FETs with different threshold voltages according to embodiments of the present disclosure.

FIG. 5A shows a plan view (layout) of a CMOS circuit, FIG. 5B shows a cross sectional view corresponding to area A1 of FIG. 5A and FIG. 5C shows an enlarged view of area B1 of FIG. 5B according to an embodiment of the present disclosure.

FIG. 6A shows a plan view (layout) of a CMOS circuit, FIG. 6B shows a cross sectional view corresponding to area A1 of FIG. 6A and FIG. 6C shows an enlarged view of area B1 of FIG. 6B according to an embodiment of the present disclosure.

FIGS. 10A, 10B, 10C, 10D, 10E and 10F show cross sectional views of various stages of a sequential manufacturing process of a semiconductor device according to embodiments of the present disclosure.

DETAILED DESCRIPTION

Figure 3C:
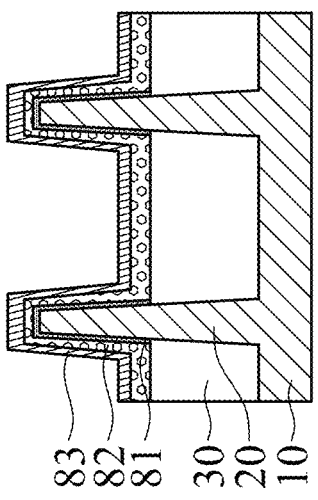
FIGS. 3A, 3B, 3C, 3D, 3E and 3F show cross sectional views of various stages of a sequential manufacturing process of a semiconductor device according to an embodiment of the present disclosure.
Figure 3F:
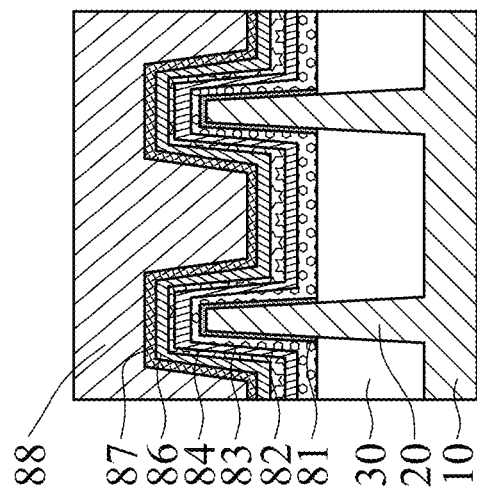

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. In the entire disclosure, a source and a drain are interchangeably used, and a source/drain refers to one of or both of the source and the drain. In the following embodiments, materials, configurations, dimensions, processes and/or operations as described with respect to one embodiment (e.g., one or more figures) may be employed in the other embodiments, and detailed description thereof may be omitted.

Disclosed embodiments relate to a semiconductor device, in particular, a gate structure of a field effect transistor (FET) and its manufacturing method. The embodiments such as those disclosed herein are generally applicable not only to planar FETs but also to a fin FET (FinFET), a double-gate FET, a surround-gate FET, an omega-gate FET or a gate-all-around (GAA) FET (such as a lateral gate-all-around FET or a vertical gate-all-around FET), and/or nanowire transistors, nanosheet transistors, nanoforksheet transistors, nanostructure transistor, nanoslab transistors or any suitable device having one or more work function adjustment material (WFM) layers in the gate structure.

With increasing down-scaling of integrated circuits, the spacing between nearby devices is decreasing and the different threshold voltage devices are coming close together causing threshold voltage shift due to diffusion of metals (like Al) from one device into another. In FET structures, building multiple Vt devices with low Vt is very crucial for low power consumption and boosting device performance. Composition and thickness of metal gate films play a crucial role in defining the device work function, Vt. Multiple FETs having different threshold voltages can be realized by adjusting materials and/or thicknesses of one or more work function adjustment material layers (WFMs) disposed between a gate dielectric layer and a body metal gate electrode layer (e.g., a W layer). For an n-type FET having a Si channel and/or a p-type FET having a SiGe channel, an aluminum containing layer, such as TiAl, TiAlC, TaAl and/or TaAlC, is used as a WFM layer. However, when the aluminum containing layer is formed over an underlying layer, such as a WCN, WN and/or TiN layer as a WFM layer, Al diffusion into the WCN, WN and/or TiN layer of nearby devices causes a threshold voltage change and/or other degradation of FET properties.

The present disclosure relates to the use of a aluminum diffusion barrier layer at an upper surface and/or a bottom surface of a WFM layer containing aluminum. As will be discussed in the following, the present disclosure provides devices and methods that can protect the underlying layer on the same FET device and also protect the high-k and/or the WFM layers in nearby FET devices from Al diffusion from the WFM layer containing aluminum.

FIG. 1A shows a cross section view of a semiconductor device according to an embodiment of the present disclosure.

In some embodiments, a semiconductor device includes a gate stack 80 disposed over a channel region of a fin structure 20. The gate stack 80 includes an interfacial layer 81, a gate dielectric layer 82, a first conductive layer 83 as a cap layer, a second conductive layer 84 as a first barrier layer, a work function adjustment material layer or a work function adjustment layer (a WFM layer) 86, a glue layer 87 and a body gate electrode layer 88 as shown in FIG. 1A. In some embodiments, the fin structure 20 is provided over a substrate 10 and protrudes from an isolation insulating layer 30. Further, gate sidewall spacers 46 are disposed on opposite side faces of the gate stack 80 and one or more dielectric layers 50 are formed to cover the gate sidewall spacers 46. In some embodiments, a piece of insulating material 42 is disposed between the gate sidewall spacer 46 and the isolation insulating layer 30. Further, as shown in FIG. 1B, source/drain epitaxial layers 60 are formed over recessed fin structures. Although FIG. 1A shows two fin structures and FIG. 1B shows three fin structures, the number of fin structures is not limited to those shown in FIGS. 1A and 1B.

In some embodiments, the fin structure (a channel region) is made of Si for an n-type FET and is made of SiGe for a p-type FET. A Ge concentration of SiGe is in a range from about 20 atomic % to 60 atomic % in some embodiments, and is in a range from about 30 atomic % to 50 atomic % in other embodiments. In some embodiments, the channel region of the n-type FET include Ge, of which amount is smaller than the SiGe channel of the p-type FET. In other embodiments, the channel regions of a p-type FET and an n-type FET are both made of Si or compound semiconductor.

In some embodiments, the first conductive layer 83 includes a metal nitride, such as WN, TaN, TiN and TiSiN. In some embodiments, TiN is used. The thickness of the first conductive layer 83 is in a range from about 0.3 nm to about 30 nm in some embodiments, and is in a range from about 0.5 nm to about 25 nm in other embodiments. In some embodiments, the first conductive layer 83 is crystalline having, e.g., columnar crystal grains. In some embodiments, the first conductive layer 83 is not formed. In some embodiments, the first conductive layer 83 is formed and then removed with after annealing operation with a wet etching process.

In some embodiments, the second conductive layer 84 includes a metal nitride, such as WN, TaN, TiN and TiSiN. In some embodiments, TaN is used. The thickness of the second conductive layer 84 is in a range from about 0.3 nm to about 30 nm in some embodiments, and is in a range from about 0.5 nm to about 25 nm in other embodiments. In some embodiments, the second conductive layer 84 functions as a barrier layer or an etch stop layer. In some embodiments, the second conductive layer 84 is thinner than the first conductive layer 83. In some embodiments, the second conductive layer 84 is not formed.

In some embodiments, the WFM layer 86 is made of a conductive material such as a single layer of TiN, WN, WCN, Ru, W, TaAlC, TiC, TaAl, TaC, Co, Al, TiAl, or TiAlC, or a multilayer of two or more of these materials. For an n-type FET having a Si channel, an aluminum containing layer, such as TiAl, TiAlC, TaAl and/or TaAlC, is used. In some embodiments, optionally one or more of TaN, TiN, WN, TiC, WCN, MoN and/or Co formed under the aluminum containing layer are used. For a p-type FET having a SiGe channel, one or more of TaN, TiN, WN, TiC, WCN, MoN and Co are used. In some embodiments, one or more of TiAl, TiAlC, TaAl and TaAlC formed thereon are used.

In some embodiments, the glue layer 87 is made of one or more of TiN, Ti, and Co. In some embodiments, the body gate electrode layer 88 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

As set forth above, the first conductive layer 83 and the second conductive layer 84 are not formed in some embodiments. In such a case, one or more WFM layers are formed directly on the gate dielectric layer 82.

FIGS. 2A-3F show cross sectional views of various stages of a sequential manufacturing process of the semiconductor device according to an embodiment of the present disclosure. FIG. 3G shows a process flow of manufacturing a semiconductor device according to an embodiment of the present disclosure. It is understood that in the sequential manufacturing process, one or more additional operations can be provided before, during, and after the stages shown in FIGS. 2A-3F, and some of the operations described below can be replaced or eliminated for additional embodiments of the method. The order of the operations/processes may be interchangeable.

As shown in FIG. 2A, one or more fin structures 20 are fabricated over a substrate 10. The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

In some embodiments, a part of the substrate 10 for p-type FETs are recessed by etching and a SiGe layer is formed over the recesses. FIGS. 2A-3F show the case of an n-FET, but most of the fabrication process is substantially the same for a p-type FET.

The fin structures 20 can be patterned by any suitable method. For example, the fin structures 20 can be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 2A, two fin structures 20 extending in the Y direction are disposed adjacent to each other in the X direction. However, the number of the fin structures is not limited to two. The numbers may be one, three, four or five or more. In addition, one or more dummy fin structures may be disposed adjacent to both sides of the fin structures 20 to improve pattern fidelity in patterning processes. The width of the fin structure 20 is in a range of about 5 nm to about 40 nm in some embodiments, and is in a range of about 7 nm to about 15 nm in certain embodiments. The height of the fin structure 20 is in a range of about 100 nm to about 300 nm in some embodiments, and is in a range of about 50 nm to 100 nm in other embodiments. The space between the fin structures 20 is in a range of about 5 nm to about 80 nm in some embodiments, and is in a range of about 7 nm to 15 nm in other embodiments. One skilled in the art will realize, however, that the dimensions and values recited throughout the descriptions are merely examples, and may be changed to suit different scales of integrated circuits.

After the fin structures 20 are formed, an isolation insulating layer 30 is formed over the fin structures 20, as shown in FIG. 2B.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), a mixture of MSQ and HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of spin-on-glass (SOG), SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (e.g., the pad oxide layer and the silicon nitride mask layer formed on the pad oxide layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 2B.

In certain embodiments, the partial removing of the isolation insulating layer 30 is performed using a wet etching process, for example, by dipping the substrate in hydrofluoric acid (HF). In another embodiment, the partial removing of the isolation insulating layer 30 is performed using a dry etching process. For example, a dry etching process using CHF$_3$ or BF$_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an N$_2$, Ar or He ambient.

Then, a dummy gate structure 40 is formed over part of the fin structures 20 as shown in FIG. 2C.

A dielectric layer and a poly silicon layer are formed over the isolation insulating layer 30 and the exposed fin structures 20, and then patterning operations are performed so as to obtain a dummy gate structure including a dummy gate electrode layer 44 made of poly silicon and a dummy gate dielectric layer 42. The patterning of the poly silicon layer is performed by using a hard mask including a silicon nitride layer and an oxide layer in some embodiments. The dummy gate dielectric layer 42 can be silicon oxide formed by CVD, PVD, ALD, e-beam evaporation, or other suitable process. In some embodiments, the dummy gate dielectric layer 42 includes one or more layers of silicon oxide, silicon nitride, silicon oxy-nitride, or high-k dielectrics. In some embodiments, a thickness of the dummy gate dielectric layer is in a range of about 1 nm to about 5 nm.

In some embodiments, the dummy gate electrode layer 44 is doped poly-silicon with uniform or non-uniform doping. In the present embodiment, the width of the dummy gate electrode layer 44 is in the range of about 30 nm to about 60 nm. In some embodiments, a thickness of the dummy gate electrode layer is in a range of about 30 nm to about 50 nm. In addition, one or more dummy gate structures may be disposed adjacent to both sides of the dummy gate structure 40 to improve pattern fidelity in patterning processes. The width of the dummy gate structure 40 is in a range of about 5 nm to about 40 nm in some embodiments, and is in a range of about 7 nm to about 15 nm in certain embodiments.

Further, as shown in FIGS. 2C and 2D, sidewall spacers 46 are formed on opposite side faces of the dummy gate structures 40. FIG. 2D is a cross section in the y-x plane. An insulating material layer for sidewall spacers 46 is formed over the dummy gate structure 40. The insulating material layer is deposited in a conformal manner so that it is formed to have substantially equal thicknesses on vertical surfaces, such as the sidewalls, horizontal surfaces, and the top of the dummy gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, bottom portions of the insulating material layer are removed by anisotropic etching, thereby forming gate sidewall spacers 46. In some embodiments, the sidewall spacers 46 include two to four layers of different insulating materials. In some embodiments, part of the dummy gate dielectric layer 42 is disposed between the sidewall spacers 46 and the isolation insulating layer 30. In other embodiments, no part of the dummy gate dielectric layer 42 is disposed between the sidewall spacers 46 and the isolation insulating layer 30.

Subsequently, a source/drain region of the fin structure 20 not covered by the dummy gate structure 40 is etched down (recessed) to form a source/drain recess in some embodiments. After the source/drain recess is formed, one or more source/drain epitaxial layers 60 (see, FIG. 1B) are formed in the source/drain recess. In some embodiments, a first epitaxial layer, a second epitaxial layer and a third epitaxial layer are formed. In other embodiments, no recess is formed and the epitaxial layers are formed over the fin structure.

In some embodiments, the first epitaxial layer includes SiP or SiCP for an n-type FinFET, and SiGe or Ge doped with B for a p-type FinFET. An amount of P (phosphorus) in the first epitaxial layer is in a range from about $1\times10^{18}$ atoms/cm$^3$ to about $1\times10^{20}$ atoms/cm$^3$, in some embodiments. The thickness of the first epitaxial layer is in a range of about 5 nm to 20 nm in some embodiments, and in a range of about 5 nm to about 15 nm in other embodiments. When the first epitaxial layer is SiGe, an amount of Ge is about 25 atomic % to about 32 atomic % in some embodiments, and is about 28 atomic % to about 30 atomic % in other embodiments. The second epitaxial layer includes SiP or SiCP for an n-type FinFET, and SiGe doped with B for a p-type FinFET, in some embodiments. In some embodiments, an amount of phosphorus in the second epitaxial layer is higher than the phosphorus amount of the first epitaxial layer and is in a range about $1\times10^{20}$ atoms/cm$^3$ to about $2\times10^{20}$ atoms/cm$^3$. The thickness of the second epitaxial layer is in a range of about 20 nm to 40 nm in this embodiment, or in a range of about 25 nm to about 35 nm in other embodiments. When the second epitaxial layer is SiGe, an amount of Ge is about 35 atomic % to about 55 atomic % in some embodiments, and is about 41 atomic % to about 46 atomic % in other embodiments. The third epitaxial layer includes a SiP epitaxial layer in some embodiments. The third epitaxial layer is a sacrificial layer for silicide formation in the source/drain. An amount of phosphorus in the third epitaxial layer is less than the phosphorus amount of the second epitaxial layer and is in a range of about $1\times10^{18}$ atoms/cm$^3$ to about $1\times10^{21}$ atoms/cm$^3$ in some embodiments. When the third epitaxial layer is SiGe, an amount of Ge is less than about 20 atomic % in some embodiments, and is about 1 atomic % to about 18 atomic % in other embodiments.

In at least one embodiment, the epitaxial layers 60 are epitaxially-grown by an LPCVD process, molecular beam epitaxy, atomic layer deposition or any other suitable method. The LPCVD process is performed at a temperature of about 400 to 850° C. and under a pressure of about 1 Torr to 200 Torr, using silicon source gas such as $SiH_4$, $Si_2H_6$, or $Si_3H_8$; germanium source gas such as $GeH_4$, or $Ge_2H_6$; carbon source gas such as $CH_4$ or $SiH_3CH_3$ and phosphorus source gas such as $PH_3$.

Then, as shown in FIGS. 2C and 2D, an interlayer dielectric (ILD) layer 50 is formed over the S/D epitaxial layer 60 and the dummy gate structure 40. The materials for the ILD layer 50 include compounds comprising Si, O, C and/or H, such as silicon oxide, SiCOH and SiOC. Organic materials, such as polymers, may be used for the ILD layer 50.

After the ILD layer 50 is formed, a planarization operation, such as CMP, is performed, so that the top portion of the dummy gate electrode layer 44 is exposed, as shown in FIGS. 2C and 2D. In some embodiments, before the ILD layer 50 is formed, a contact etch stop layer, such as a silicon nitride layer or a silicon oxynitride layer, is formed.

Then, the dummy gate electrode layer 44 and the dummy gate dielectric layer 42 are removed, thereby forming a gate space 47 as shown in FIGS. 2E and 2F. FIG. 2F is a cross section in the y-x plane. The dummy gate structures can be removed using plasma dry etching and/or wet etching. When the dummy gate electrode layer 44 is polysilicon and the ILD layer 50 is silicon oxide, a wet etchant such as a TMAH solution can be used to selectively remove the dummy gate electrode layer 44. The dummy gate dielectric layer 42 is thereafter removed using plasma dry etching and/or wet etching.

Figure 3B:
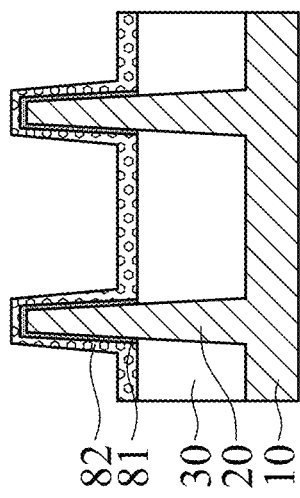
Figure 3E:
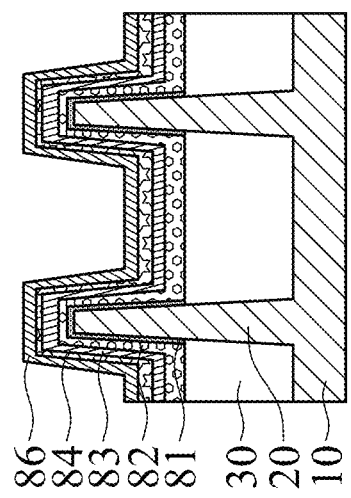
Figure 3A:
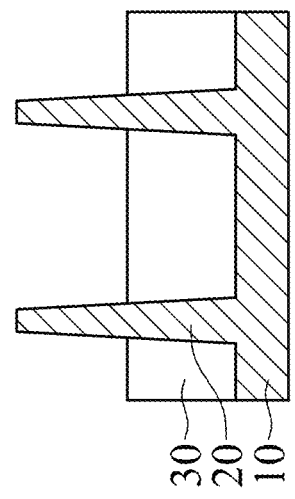
Figure 3D:
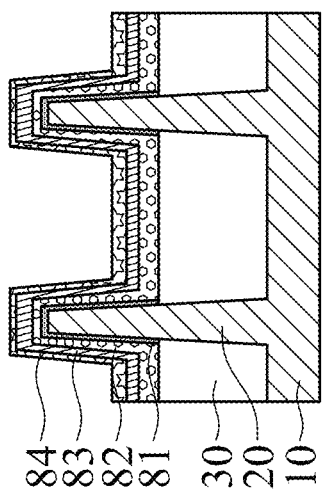

FIG. 3A shows the structure after the channel region of the fin structures 20 are exposed in the gate space 47. In FIGS. 3A-3F, the sidewall spacers 46 and the ILD layer 50 are omitted.

Figure 3G:
FIG. 3G shows a process flow of manufacturing a semiconductor device according to an embodiment of the present disclosure.

As shown in FIG. 3B, at S301 of FIG. 3G, an interfacial layer 81 is formed on the fin structure 20 and, at S303 of FIG. 3G, a gate dielectric layer 82 is formed on the interfacial layer 81. In some embodiments, the interfacial layer is formed by using chemical oxidation. In some embodiments, the interfacial layer 81 includes one of silicon oxide, silicon nitride and silicon-germanium oxide. In some embodiments, when the channel is made of Si, the interfacial layer is a silicon oxide layer 81N, and when the channel is made of SiGe, the interfacial layer is silicon-germanium oxide layer 81P (see, FIG. 4A). The thickness of the interfacial layer 81 is in a range from about 0.6 nm to about 2 nm in some embodiments. In some embodiments, the gate dielectric layer 82 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof. The gate dielectric layer 82 may be formed by CVD, ALD or any suitable method. In one embodiment, the gate dielectric layer 82 is formed using a highly conformal deposition process such as ALD in order to ensure the formation of a gate dielectric layer having a uniform thickness around each channel layer. The thickness of the gate dielectric layer 82 is in a range from about 1 nm to about 30 nm in one embodiment.

Then, as shown in FIG. 3C, at S305 of FIG. 3G, a first conductive layer 83 is formed. The first conductive layer 83 can be formed by CVD, ALD or any suitable method in some embodiments. In some embodiments, the first conductive layer 83 is made of TiN or TiSiN. In some embodiments, no first conductive layer 83 is formed.

In some embodiments, at S307 of FIG. 3G, after the first conductive layer 83 is formed, a first annealing operation is performed for about 1 nsec (spike annealing, such as a laser annealing and/or isothermal annealing) to about 360 sec at a temperature of about 600° C. to about 950° C. in some embodiments. The first annealing can help to densify the gate dielectric layer 82 and to incorporate nitrogen into the gate dielectric layer 82. Nitrogen helps to passivate oxygen vacancies, reduces leakage and improves device reliability. The first annealing can also help to form a stable intermixing layer, which helps to provide a stable platform for subsequent metal gate film deposition onto the dielectric layer. When the temperature is too high, the first annealing may cause crystallization and grain boundary formation in the high-k gate dielectric layer 82, which impacts leakage performance and regrowth of the interfacial layer 81, which slows down device speed. In contrast, when the temperature is too low, the first annealing may not provide sufficient densification and/or nitridation in the high-k gate dielectric layer and cause device instability/variations during subsequent metal gate deposition processes. In some embodiments, when no first conductive layer 83 is formed, no annealing operation at this stage is performed. In some embodiments, the first conductive layer 83 is formed and then an annealing operation is performed; thereafter the first conductive layer 83 is removed with a wet etching process.

In some embodiments, the stacked structure including the interfacial layer 81, the gate dielectric layer 82 and the first conductive layer 83 is soaked in a fluorine containing gas (e.g., $F_2$ and/or $NF_3$) for about 4 sec to about 15 min at a temperature of about room temp (25° C.) to about 550° C. in some embodiments. Incorporation of fluorine helps to improve the work function adjustment properly, decrease Vt of a PMOS device, passivate oxygen vacancies in the gate dielectric layer 82, reduce leakage and reduce dangling bonds in the gate dielectric layer. Thereafter, a capping layer made of, for example a crystalline, polycrystalline or amorphous Si, is formed over the first conductive layer 83, and a second annealing operation is performed for about 1 nsec (spike annealing, such as a laser annealing) to about 360 sec at a temperature of about 550° C. to about 1300° C. in some embodiments. In some embodiments, the annealing temperature is from 900° C. to 1100° C. This results in the diffusion of the fluorine into the capping layer, the first conductive layer 83 and the gate dielectric layer 82 in some embodiments. After the second annealing operation, the capping layer is removed. The second annealing with the Si capping layer also helps to improve the quality of the gate dielectric layer 82. A gate dielectric layer, such as a high-k dielectric layer, is formed at a relatively low temperature to avoid crystallization and grain boundary formation, while metal gate films are deposited at relatively higher temperatures. Accordingly, it is desirable to make the high-k dielectric layer more thermally stable before the metal gate deposition. The second annealing with the capping layer at the temperature ranges as set forth above can densify the high-k dielectric layer, and make it thermally stable, without any thermal oxide inversion during the metal gate deposition. The second annealing also helps to thermally in-diffuse the fluorine from the outer layers (e.g., the capping layer) into the first conductive layer 83, the gate dielectric layer 82 and the interfacial layer 81. The capping layer is used to protect the gate dielectric layer 82 and the first conductive layer 83 from undesirable oxidation damage and to isolate these films from the annealing atmosphere. After thermal stabilization of the gate dielectric layer, the capping layer is no longer required in the final device structure and therefore it is removed.

In other embodiments, no fluorine soaking operation accompanying formation of a Si capping layer and a second annealing operation is performed.

Subsequently, at S309 of FIG. 3G, a second conductive layer, as a first barrier layer 84 is formed, and then at S311 of FIG. 3G, one or more WFM layers 86 are formed. A metal gate layer including a glue layer 87 and a body metal layer (gate electrode layer) 88 is formed above the work function adjustment layer 86, at S313 of FIG. 3G.

In some embodiments, the second conductive layer 84 is made of TaN and serves as an etch stop barrier layer. The barrier layer 86 acts as a wet etching stop layer during patterning of p-type and n-type WFM layers subsequently formed to form multiple Vt devices. In some embodiments, no second conductive layer 84 is formed.

The work function adjustment material (WFM) layer 86 can be formed by ALD, PVD, CVD, e-beam evaporation, or other suitable process. Further, the WFM layer can be formed separately for the n-channel FET and the p-channel FET which may use different metal layers. The gate electrode layer (body metal layer) 88 and the glue layer 87 can be formed by CVD, ALD, electro-plating, or other suitable method. When the first and second conductive layers are not formed, the WFM layer 86 is directly formed on the gate dielectric layer 82. In some embodiment, the first conducting layer 83 is formed and removed after annealing operation S307, thereafter second conductive layer is not formed and the WFM layer 86 is directly formed on the gate dielectric layer 82.

Figures 4A, 4B:
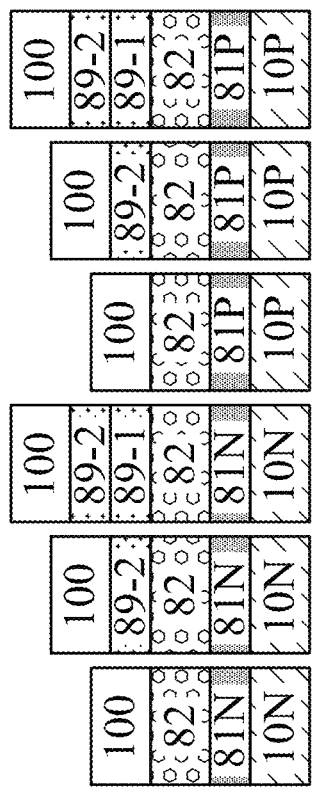

FIG. 4A shows a cross section view of gate structures for FETs with different threshold voltages according to an embodiment of the present disclosure. FIGS. 4B and 4C show various work function adjustment material layers for multiple FETs with different threshold voltages according to embodiments of the present disclosure.

In some embodiments, a semiconductor device includes a first n-type FET N1 having a WFM layer structure WF1, a second n-type FET N2 having a WFM layer structure WF2, a third n-type FET N3 having a WFM layer structure WF3, a first p-type FET P1 having the WFM layer structure WF3, a second p-type FET P2 having the WFM layer structure WF2, and a third p-type FET P3 having the WFM layer structure WF1. A threshold voltage of the first n-type FET N1 (ultra-low voltage FET) is smaller in an absolute value than a threshold voltage of the second n-type FET N2 (low-voltage FET) and the threshold voltage of the second n-type FET N2 is smaller in an absolute value than a threshold voltage of the third n-type FET N3 (standard voltage FET). Similarly, a threshold voltage of the first p-type FET P1 (ultra-low voltage FET) is smaller in an absolute value than a threshold voltage of the second p-type FET P2 (low voltage FET) and the threshold voltage of the second p-type FET P2 is smaller in an absolute value than a threshold voltage of the third p-type FET P3 (standard voltage FET). The threshold voltage in an absolute value of the first n-type FET N1 is designed to have the same threshold voltage in an absolute value of the first p-type FET P1, the threshold voltage in an absolute value of the second n-type FET N2 is designed to have the same threshold voltage in an absolute value of the second p-type FET P2, and the threshold voltage in an absolute value of the third n-type FET N3 is designed to have the same threshold voltage of the third p-type FET P3.

In some embodiments, the WFM layer structure WF1 includes a first WFM layer 100, the WFM layer structure WF2 includes, closer to the gate dielectric layer 82, a second WFM layer 89-2 and the first WFM layer 100, and the third WFM layer structure WF3 includes, closer to the gate dielectric layer 82, a third WFM layer 89-1, the second WFM layer 89-2 and the first WFM layer 100, as shown in FIG. 4A.

In FIG. 4B, the semiconductor device include three different threshold voltage levels. In other embodiments, as shown in FIG. 4C, more than three, e.g., eight different threshold voltages are utilized for an n-type FET and a p-type FET, respectively. In FIG. 4C, not only the WFM layer structures but also configurations HK1, HK2 and HK3 of the gate dielectric layer 82 (e.g., material, thickness, and etc) are adjusted to obtain a desired threshold voltage. HK1, HK2, HK3 are composed of different materials such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, $La_2O_3$, $HfO_2$—$La_2O_3$, $Y_2O_3$, $Dy_2O_3$, $Sc_2O_3$, MgO or other suitable high-k dielectric materials, and/or combinations thereof. In some embodiments, HK1, HK2 and HK3 are composed of a high-k dielectric with a different concentrations of rare-earth metal and/or Group-III dopants (such as, La, Al, Mg, Sc, Dy, Y, Ti, Lu, Sr etc.). In some embodiments, HK3 is composed of HfLaOx, HK2 is composed of HfLaOx (or HfYOx, HfLuOx, HfSrOx, HfScOx, HfDyOx) and HK1 is composed of HfLaOx (or HfYOx, HfLuOx, HfSrOx, HfScOx, HfDyOx), such that the amount of La (or Y, Lu, Sr, Sc, Dy) in HK1 is higher than that in HK2. In some embodiment, HK1 is composed of HfOx, HK2 is composed of HfAlOx (or HfZrOx, HfTiOx) and HK3 is composed of HfAlOx (or HfZrOx, HfTiOx), such that the amount of Al (or Zr, Ti) in HK3 is higher than that in HK2. In some embodiment, HK2 is composed of HfOx, HK1 is composed of HfLaOx (or HfYOx, HfLuOx, HfSrOx, HfScOx, HfDyOx) and HK3 is composed of HfAlOx (or HfZrOx, HfTiOx). In some embodiments, HK1 includes La in an amount greater than HK2 and HK3 does not include La. In some embodiments, HK3 includes Al in an amount greater than HK2 and HK1 does not include Al. In some embodiments, HK1 includes La, HK3 includes Al, and HK2 does not include Al and La. The thicknesses of HK1, HK2, HK3 are in the range from about 0.6 nm to about 30 nm in some embodiments. In some embodiments, more than three different high-k dielectric films are used.

In a CMOS device, a gate electrode is commonly used for (shared by) an n-type FET and p-type FET, and thus an n-type FET and p-type FET having substantially the same threshold voltage are selected. For example, a CMOS device having an ultra-low voltage FET includes the first n-type FET N1 and the first p-type FET P1. FIG. 5A shows a plan view (layout) of such a CMOS device.

As shown in FIG. 5A, a gate electrode 80 is disposed over one or more fin structures 20 (channel regions). In some embodiments, each of the n-type FET NFET and the p-type FET PFET includes two fin structures. In other embodiments, the number of the fin structures per FET is one or three or more (up to, e.g., 10). FIG. 5B shows a cross sectional view corresponding to area A1 of FIG. 5A and FIG. 5C shows an enlarged view of area B1 of FIG. 5B. In FIGS. 5B and 5C, the glue layer 87 and the body metal layer 88 (shown in broken line) are omitted.

As set forth above, the n-type FET NFET (e.g., N1) has the WFM layer structure WF1 having the first WFM layer 100 (only), and the p-type FET (e.g., P1) has the WFM layer structure WF3 having the second and third WFM layers (89-2 and 89-1, which are collectively referred to as 89 in FIG. 5B) and the first WFM layer 100. Accordingly, in the boundary MB of the n-type FET NFET and the p-type FET PFET, the second and third WFM layers 89 are discontinuously formed.

Similarly, in FIGS. 6A-6C, a CMOS device having a threshold voltage Vt3 includes an n-type FET with a WFM layer structure WF2 and a p-type FET with a WFM layer structure WF3 (see, FIG. 4C). FIG. 6B shows a cross sectional view corresponding to area A2 of FIG. 6A and FIG. 6C shows an enlarged view of area B2 of FIG. 6B. In FIGS. 6B and 6C, the glue layer 87 and the body metal layer 88 are omitted.

As shown in FIG. 6A, a gate electrode 80 is disposed over one or more fin structures 20 (channel regions). As set forth above, the n-type FET NFET has the WFM layer structure WF2 having the first WFM layer 100 and the second WFM layer 89-2, and the p-type FET has the WFM layer structure WF3 having the second and third WFM layers and the first WFM layer 100. Accordingly, at the boundary MB of the n-type FET NFET and the p-type FET PFET, the third WFM layer 89-1 is discontinuously formed.

When the first WFM layer 100 includes aluminum, aluminum may diffuse into the second and/or third WFM layers 89 across the boundary MB, and may change the threshold voltage of the p-type FET PFET (and may change the threshold voltage of the n-type FET NFET). In particular, when diffused Al forms aluminum oxide, which has a high electrical resistivity, device performance of the p-type FET PFET would be reduced. Further, lateral diffusion of Al into the second WFM layer 89-2 affects the threshold voltage more than vertical diffusion of Al from the top of the second WFM layer 89-2. With increasing down-scaling of integrated circuits, the spacing between nearby p-type FET and n-type FET devices is decreasing and these FET devices are coming close together. Therefore, the lateral diffusion across the nearby devices is becoming critical and causing severe threshold voltage shifts and performance degradation.

According to some embodiments of the present disclosure, the WFM layer 100 contains aluminum (e.g., TiAl and TiAlC), and further includes a diffusion barrier layer) at least at one of the bottom surface region and the top surface region of the WFM layer 100. In some embodiments, the diffusion barrier layer is at least one of a Ta-rich, Ta-doped, Si-doped, Ti-doped or a Ti-rich layer. The diffusion barrier layer suppress aluminum from diffusing into the WFM layers 89-1 and 89-2 of nearby FET devices, which are made of, for example, WCN, WN, Ru, TiN or TiSiN. In some embodiments, the diffusion barrier layer of the WFM layer 100 includes one of a Ti-rich TiAl layer, a Ti doped TaAl layer, a Ta-rich TaAl layer, a Ta-doped TiAl layer, a Si doped TiAl layer and a Si-doped TaAl layer.

In some embodiments, the body (center region) of the WFM layer 100 is made of TiAl or TiAlC and includes Ti in an amount of 5 atomic % to about 15 atomic % and an Al content is in a range from about 10 atomic % to about 30 atomic %, while the rest includes carbon (e.g., about 8 atomic % to about 25 atomic %) and/or oxygen in some embodiments. In some embodiments, the Al/Ti ratio is in a range from about 1.5 to about 3.0.

In some embodiments, the diffusion barrier layer contains titanium higher than the center region adjacent to the diffusion barrier layer(s) and the amount of Ti is in a range from about of 20 atomic % to about 50 atomic %, and is in a range from about 30 atomic % to 40 atomic % in other embodiments. In some embodiments, the Al/Ti ratio of the diffusion barrier layer is in a range from about 0.2 to about 1.2. In some embodiments, when the diffusion barrier layer is a Ti-rich layer, the Al/Ti ratio of the Ti-rich layer is in a range from about 0.2 to about 1.2. In some embodiments, when the diffusion barrier layer is a Ta-doped layer, the Ta-doped layer contains tantalum higher than the center region adjacent to the Ta-rich layer(s) and the amount of Ta is in a range from about of 20 atomic % to about 50 atomic %, and is in a range from about 30 atomic % to 40 atomic % in other embodiments. In some embodiments, the Al/Ta ratio of the Ta-doped layer is in a range from about 0.2 to about 1.2. Ta-doped TiAl layer is formed by ALD, PEALD or CVD method with cyclic alternate pulse-and-purges of Ta-precursor (e.g., PDMAT/TaCl$_5$), Al-precursor and Ti-precursor and Ar, He inert gas purge. In some embodiments, a process temperature is in a range from about 300° C. to about 550° C. In some embodiments, when the diffusion barrier layer is a Si-doped layer, the Si-doped layer contains silicon higher than the center region adjacent to the Si-rich layer(s) and the amount of Si is in a range from about of 20 atomic % to about 50 atomic %, and is in a range from about 30 atomic % to 40 atomic % in other embodiments. In some embodiments, the Al/Si ratio of the Si-doped layer is in a range from about 0.2 to about 1.2. Si-doped TiAl layer is formed by ALD, PEALD or CVD method with cyclic alternate pulse-and-purges of Si-precursor (SiCl$_4$, SiHCl$_3$ etc.), Al-precursor and Ti-precursor and Ar, He inert gas purge. In some embodiments, a process temperature is in a range from about 300° C. to about 550° C.

Figure 7A:
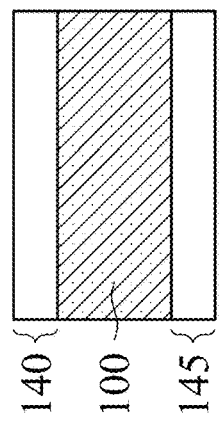
FIGS. 7A, 7B, 7C, 7D, 7E and 7F show various cross sectional views of an n-type work function adjustment material (WFM) layer according to embodiments of the present disclosure.
Figure 7C:
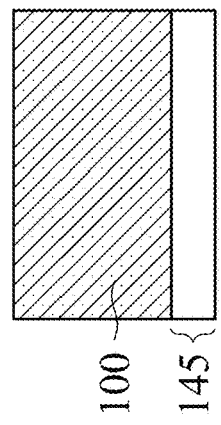
Figure 7E:
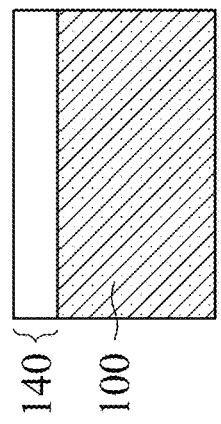
Figure 7B:
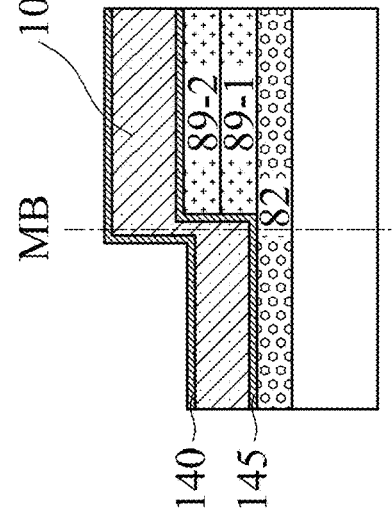
Figure 7D:
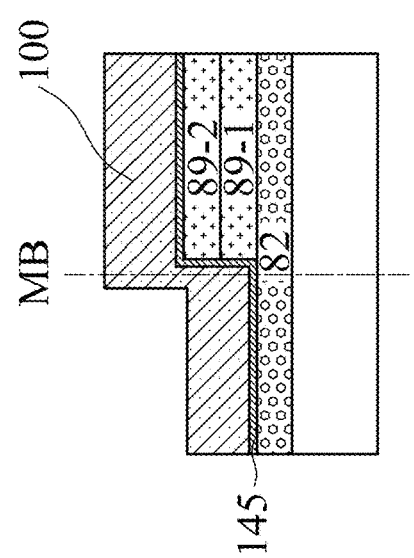

In some embodiments, as shown in FIGS. 7A and 7B, the WFM layer 100 includes a top diffusion barrier layer 140 and a bottom diffusion barrier layer 145. FIG. 7B shows a structure at the boundary MB of an n-type FET and a p-type FET similar to FIG. 5C. In some embodiments, as shown in FIGS. 7C and 7D, the WFM layer 100 includes only a bottom diffusion barrier layer 145. In these configurations, at least the bottom diffusion barrier layer 145 can suppress aluminum diffusion from the WFM layer 100 of one FET to the WFM layers 89-1 and/or 89-2 of nearby FET. Without the diffusion barrier layers, the diffusion of Al from at metal boundaries of a left FET and a right FET occurs. Due to loss of Al from WFM 100 of the left FET, the overall effective work function of the left FET increases, and due to gain in Al in WFM layers 89-1 and/or 89-2 in the right FET, the overall work function of the right FET decreases. However with the use of one or more diffusion barrier layers, such Al diffusion across metal boundaries of nearby FETs can be suppressed, giving better isolation of nearby devices.

Figure 7F:
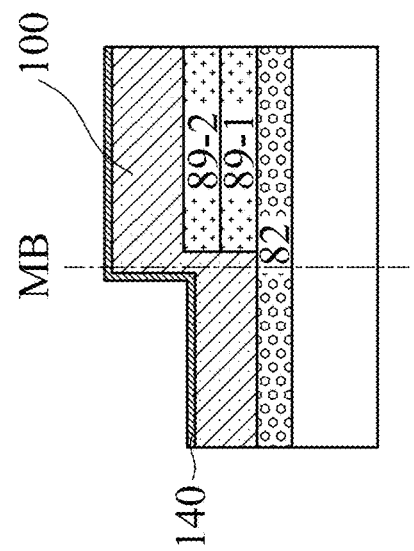

Further, in some embodiments, as shown in FIGS. 7E and 7F, the WFM layer 100 includes a top diffusion barrier layer 140 only. In such case, the top diffusion barrier layer 140 improves the quality of bulk TiAl or TiAlC layer (center region of the WFM layer 100), which in turn can also suppress aluminum diffusion from the WFM layer 100 to the WFM layers 89-1 and/or 89-2. Although the mechanism of suppressing Al diffusion is not clear, improvements in the electrical properties of the devices have been observed.

Figure 8A:
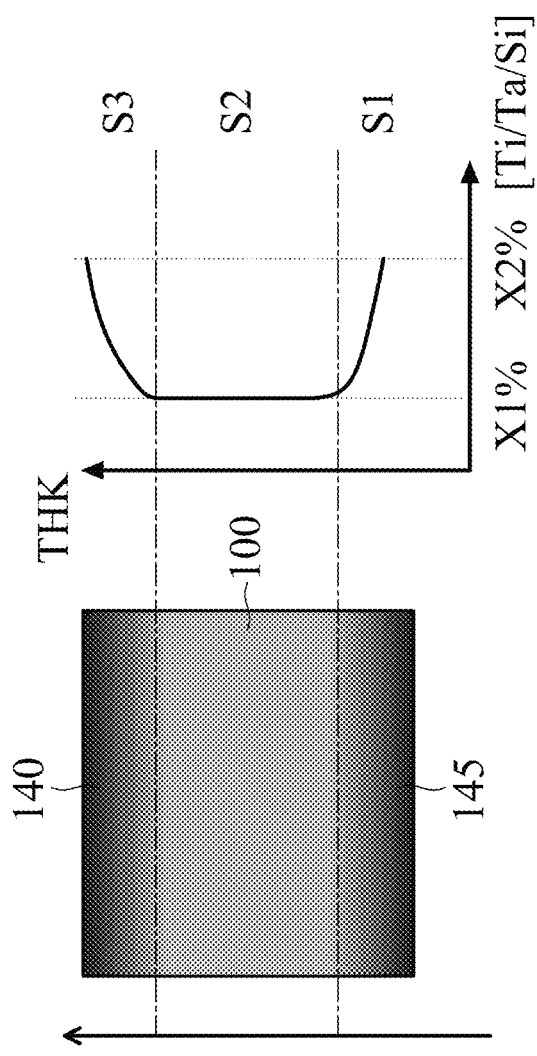
FIGS. 8A and 8B show cross sectional views and Ti concentrations of n-type work function adjustment material (WFM) layers according to embodiments of the present disclosure.
Figure 8B:
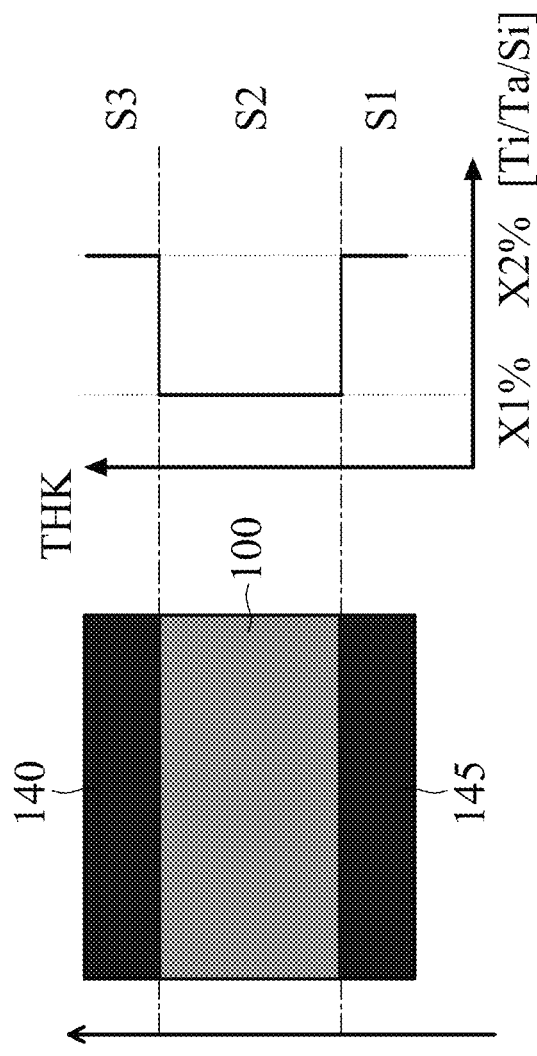

FIGS. 8A and 8B show Ta or Si or Ti profiles in the WFM layer 100 having the top and bottom diffusion barrier layers according to some embodiments.

In some embodiments, as shown in FIG. 8A, the Ta or Si or Ti concentration has a substantially constant portion S2 having a concentration X1 atomic % and the Ta or Si or Ti concentration gradually increases to X2 atomic % at the edges (top and bottom surfaces). In some embodiments, the Ta or Si or Ti concentration linearly increases, and in other embodiments, the Ta or Si or Ti concentration increases gradually (not linear). In FIG. 8B, the Ta or Si or Ti concentration has a step-wise profile.

In some embodiments, when the WFM layer 100 is made of TiAl or TiAlC, the Ti concentration is in a range from about 5 atomic % to about 15 atomic %, and is in a range from about 8 atomic % to about 12 atomic % in other embodiments; the Al concentration is in a range from about 10 atomic % to about 30 atomic %; and the rest is carbon and/or oxygen. In some embodiments, the Al/Ti ratio is in a range from about 1.5 to 4.8. When the diffusion barrier layer is a Ti-rich layer, the Ti concentration of the Ti-rich layer is in a range from about 20 atomic % to about 50 atomic %, and the Al/Ti ratio is in a range from about 0.2 to about 1.2, in some embodiments. When the diffusion barrier layer is a Ta-doped layer, the Ta concentration of the Ta-doped layer is in a range from about 20 atomic % to about 50 atomic %. When the diffusion barrier layer is a Si-doped layer, the Si concentration of the Si-doped layer is in a range from about 20 atomic % to about 50 atomic %. In some embodiments, the diffusion barrier layer is a substantially pure Ti layer (95-100 atomic %). In some embodiments, the diffusion barrier layer is a TiSi layer having the Si concentration in a range from about 25 atomic % to 65 atomic %.

In some embodiments, when the WFM layer 100 is made of TaAl or TaAlC, the Ta concentration is in a range from about 5 atomic % to about 15 atomic %, and is in a range from about 8 atomic % to about 12 atomic % in other embodiments; the Al concentration is in a range from about 10 atomic % to about 30 atomic %; and the rest is carbon and/or oxygen. In some embodiments, the Al/Ta ratio is in a range from about 1.5 to 3.0. When the diffusion barrier layer is a Ta-rich layer, the Ta concentration of the Ta-rich layer is in a range from about 20 atomic % to about 50 atomic %, and the Al/Ta ratio is in a range from about 0.2 to about 1.2, in some embodiments. When the diffusion barrier layer is a Ti-doped layer, the Ti concentration of the Ti-doped layer is in a range from about 20 atomic % to about 50 atomic %. When the diffusion barrier layer is a Si-doped layer, the Si concentration of the Si-doped layer is in a range from about 20 atomic % to about 50 atomic %. In some embodiments, the diffusion barrier layer is a substantially pure Ta layer (95-100 atomic %). In some embodiments, the diffusion barrier layer is a TiSi layer having the Si concentration in a range from about 25 atomic % to 65 atomic %.

In some embodiments, Ti atomic % X1 is in a range from about 5 to about 15 and is in a range from about 8 to about 12 in other embodiments. In some embodiments, Ti atomic % X1 is in a range from about 0 to about 2, wherein the WFM layer 100 is TaAl or TaAlC. In some embodiments, Ti atomic % X1 is in a range from about 0 to about 2, wherein the WFM layer 100 is TaAl or TaAlC, and is in a range from about 5 to about 15 in other embodiments. In some embodiments, Si atomic % X1 in a Si doped layer is in a range from about 0 to about 5. In some embodiments, X2 is in a range from about 20 to about 50 and is in a range from about 30 to about 40 in other embodiments. In some embodiments, a Ti layer containing no aluminum is used as the Ti-rich layer. In some embodiments, a Ta layer containing no aluminum is used as the Ta-rich layer. In some embodiments, a Si layer containing no aluminum is used as the Si-rich layer. In some embodiments, the thickness of the constant portion S2 is at least about 20% of the total thickness of the WFM layer 100, and is at least about 40% of the total thickness of the WFM layer 100 in other embodiments. In some embodiments, the thickness of the constant portion S2 is at most about 90% of the total thickness of the WFM layer 100, and is at most about 60% of the total thickness of the WFM layer 100 in other embodiments.

In some embodiments, the thickness of the diffusion barrier layers 140/145 is adjusted based on the Ta, Si or Ti concentration of the diffusion barrier layer. When the Ta, Si or Ti concentration is high in the diffusion barrier layers 140/145, the thickness of the diffusion barrier layer 140/145 can be small. The thickness and/or the Ta/Si/Ti concentration of the diffusion barrier layers in the WFM layer 100 is adjusted based on the desired work function of the WFM layer 100 in some embodiments.

In some embodiments, the diffusion barrier layers 140/145 can be formed by an ALD method. In the ALD method, at least one of a source gas (precursor) amount, a source gas (precursor) flow time, a gas flow ratio, a deposition temperature and a deposition pressure is changed to obtain the Ta/Si/Ti concentration profile as set forth above.

Figure 9:
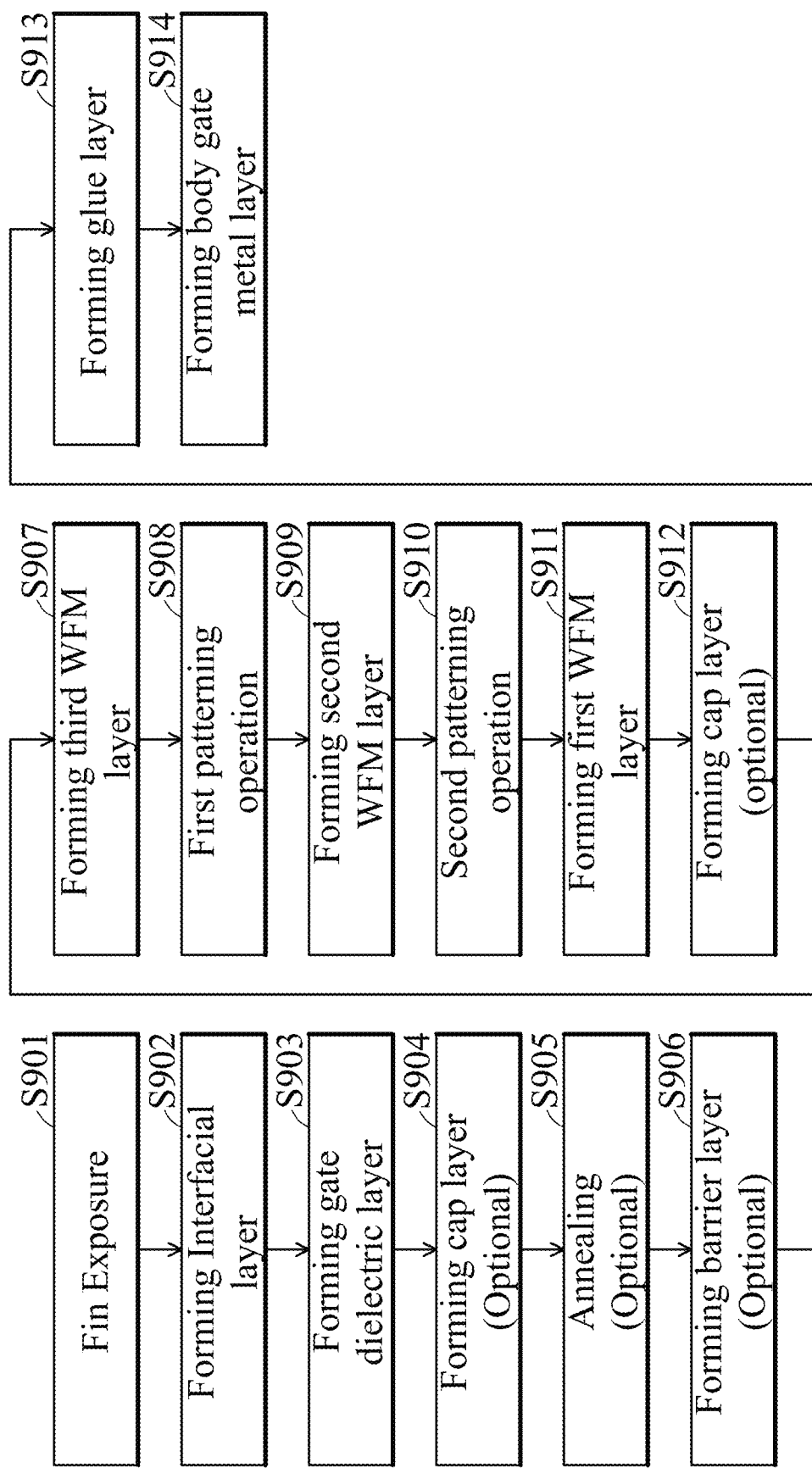
FIG. 9 shows a process flow of manufacturing a semiconductor device according to embodiments of the present disclosure.

FIG. 9 shows a process flow and FIGS. 10A-10F show cross sectional view of various stages of manufacturing the semiconductor device according to embodiments of the present disclosure. It is understood that in the sequential manufacturing process, one or more additional operations can be provided before, during, and after the stages shown in FIG. 9 and FIG. 10A-10F and some of the operations described below can be replaced or eliminated for additional embodiments of the method. The order of the operations/processes may be interchangeable. Materials, configurations, dimensions, processes and/or operations as described with respect to embodiments of FIGS. 1-8B can be employed in the following embodiments, and detailed description thereof may be omitted. Although FIGS. 10A-10F show the WFM layer 100 explained with respect to FIGS. 7A and 8A, any structure shown in FIGS. 7C, 7E and 8B can be used as the WFM layer 100.

At S901 of FIG. 9, channel regions of fin structures are exposed for a first n-type FET N1, a second n-type FET N2, a third n-type FET N3, a first p-type FET P1, a second p-type FET P2 and a third p-type FET P3, respectively. In some embodiments, the channel regions for the n-type FETs are made of Si and the channel regions for the p-type FETs are made of SiGe.

At S902 of FIG. 9, interfacial layers 81N and 81P are formed on each of the channel regions 20 using chemical oxidation methods. In some embodiments, when the channel is made of Si, the interfacial layer is a silicon oxide layer 81N, and when the channel is made of SiGe, the interfacial layer is silicon-germanium oxide layer 81P. At S903 of FIG. 9, a gate dielectric layer (e.g., a high-k gate dielectric layer) 82 is formed on the interfacial layer 81N/81P. In some embodiments, different gate dielectric layers are formed at different FET devices. In some embodiments, at S904 of FIG. 9, a cap layer 83 is formed on the gate dielectric layer 82, followed by an annealing operation at S905, and at S906 of FIG. 9, a barrier layer 84 is formed on the cap layer 83. In other embodiments, no cap layer and no barrier layer is formed. In other embodiments, a cap layer is formed, annealing is performed, and thereafter the cap layer is removed and no barrier layer is formed.

Figures 10A, 10B, 10C, 10D:
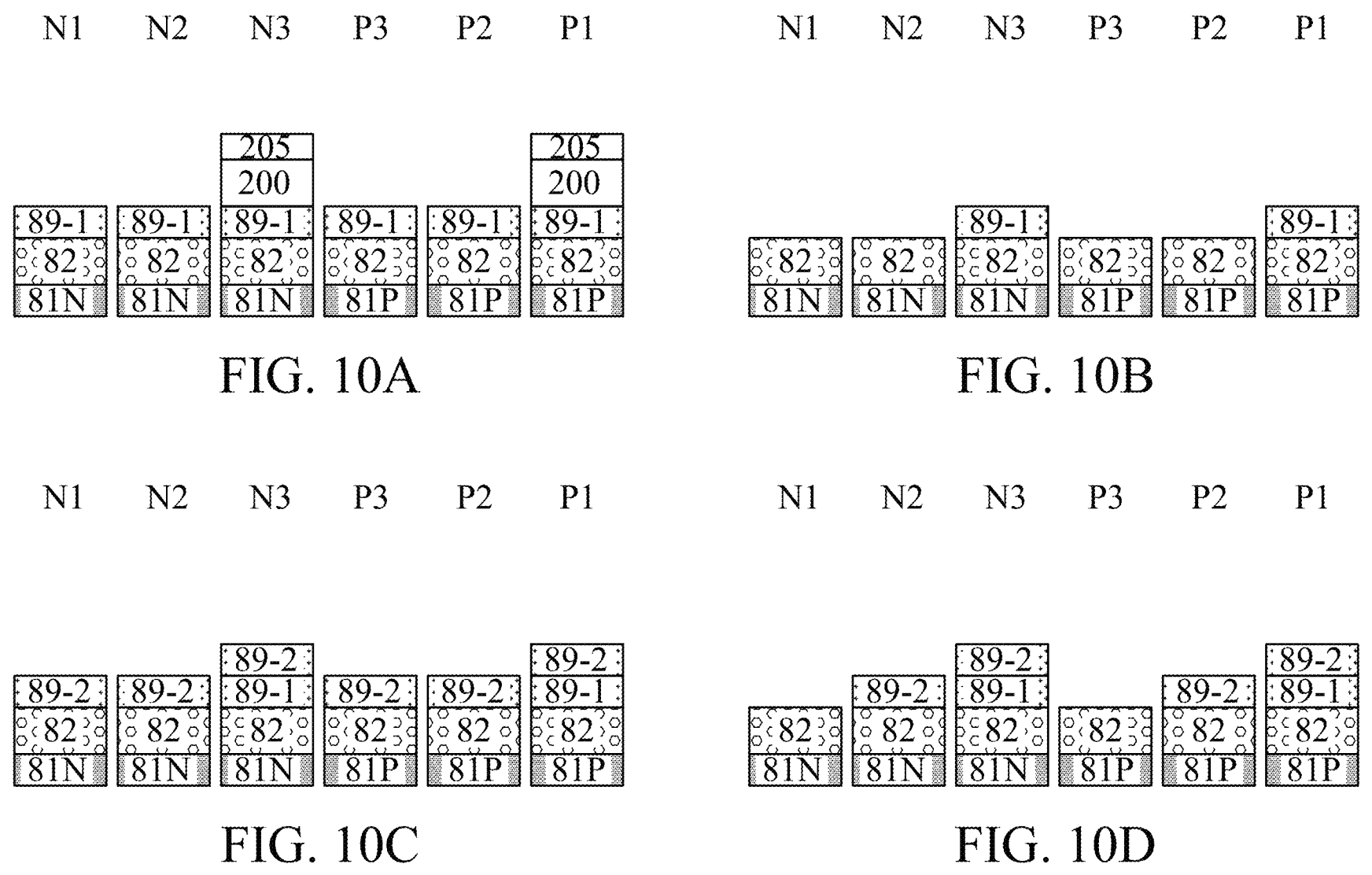

At S907 of FIG. 9, a third WFM layer 89-1 is formed on the gate dielectric layer 82 as shown in FIG. 10A. The third WFM layer 89-1 includes WN, WCN, W, Ru, TiN or TiSiN formed by, for example, CVD, ALD, PVD or any other suitable film formation methods. In some embodiments, a thickness of the third WFM layer 89-1 is in a range from about 0.5 nm to about 20 nm, and is in a range from about 1 nm to about 10 nm in other embodiments.

At S908 of FIG. 9, a first patterning operation is performed to remove the third WFM layer 89-1 from the regions for the first n-type FET N1, the second n-type FET N2, the second p-type FET P2 and the third p-type FET P3. In some embodiments, a bottom antireflective coating layer 200 made of an organic material is formed on the third WFM layer 89-1, and a photo resist layer 205 is formed on the bottom antireflective coating layer 200, as shown in FIG. 10A. By using one or more lithography operations, the photo resist layer 205 is patterned, to expose the bottom antireflective coating layer 200 at the regions for the first and second n-type FETs and the second and third p-type FETs. Then, the exposed bottom antireflective coating layer 200 is removed by one or more plasma etching operations, to expose the third WFM layer 89-1 at the regions for the first and second n-type FETs and the second and third p-type FETs, as shown in FIG. 10A. The plasma etching operation utilizes a gas including $N_2$ and $H_2$, a gas including $O_2/Cl_2$ and/or an $O_2$ gas. In some embodiments, no bottom antireflective layer is used and a photo resist layer made of organic materials is formed on the third WFM layer 89-1.

Subsequently, the third WFM layer 89-1 in the first and second n-type FETs and the second and third p-type FETs is removed by an appropriate etching operation, as shown in FIG. 10B. In some embodiments, the etching operation includes a wet etching operation. The etching solution (etchant) includes an aqueous solution of HCl and $H_2O_2$, an aqueous solution of the combination of $NH_4OH$ and $H_2O_2$, an aqueous solution of the combination of HCl, $NH_4OH$ and $H_2O_2$, an aqueous solution of HF, $NH_4OH$ and $H_2O_2$ and/or an aqueous solution of $H_3PO_4$ and $H_2O_2$.

At S909 of FIG. 9, the second WFM layer 89-2 is formed on the gate dielectric layer 82 in the regions for the first and second n-type FETs and the second and third p-type FETs and on the third WFM layer 89-1 in the regions for the third n-type FET and the first p-type FET, as shown in FIG. 10C. The second WFM layer 89-2 includes WN, WCN, W, Ru, TiN or TiSiN formed by, for example, CVD, ALD, PVD or any other suitable film formation methods. In some embodiments, a thickness of the second WFM layer 89-2 is in a range from about 0.5 nm to about 20 nm, and is in a range from about 1 nm to about 10 nm in other embodiments. In some embodiments, the second and third WFM layers are made of the same material.

At S910 of FIG. 9, a second patterning operation is performed to remove the second WFM layer 89-2 from the regions for the first n-type FET N1 and the third p-type FET P3. The second patterning operation is substantially the same as or similar to the first patterning operation. FIG. 10D shows the structure after the second WFM layer 89-2 is removed from the regions for the first n-type FET N1 and the third p-type FET P3.

Figures 10E, 10F:
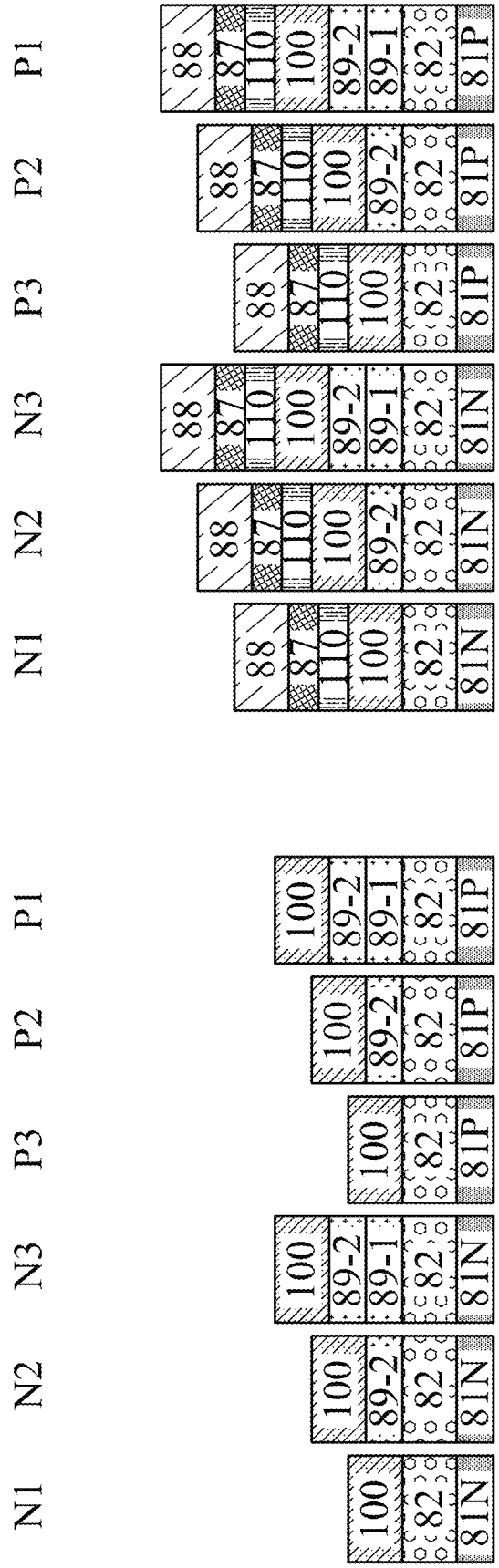

At S911 of FIG. 9, the first WFM layer 100 is formed on the gate dielectric layer 82 in the regions for the first n-type FET and the third p-type FET and on the second WFM layer 89-2 in the regions for the second and third n-type FETs and the first and second p-type FETs, as shown in FIG. 10E. The first WFM layer 100 is formed by, for example, ALD in some embodiments. In some embodiments, a thickness of the first WFM layer 100 is in a range from about 0.6 nm to about 40 nm, and is in a range from about 1 nm to about 20 nm in other embodiments. In some embodiments, the thickness of the first WFM layer 100 is greater than each of the second and third WFM layers.

At S912 of FIG. 9, a cap layer 110 is formed on the first WFM layer 100. In some embodiments, the cap layer 110 includes one or more metal nitride layers, such as TiN, TaN, TaTiN, WN, TiSiN, WCN and MoN. In other embodiments, no cap layer is formed.

At S913 of FIG. 9, a glue layer 87 is formed and then a body gate metal layer 88 is formed at S914 of FIG. 9, as shown in FIG. 10F. In some embodiments, the glue layer 87 is made of TiN, Ti and/or Co. In some embodiments, the body metal layer 88 is made of W, Al, Co, or any other suitable metal material.

Figure 11:
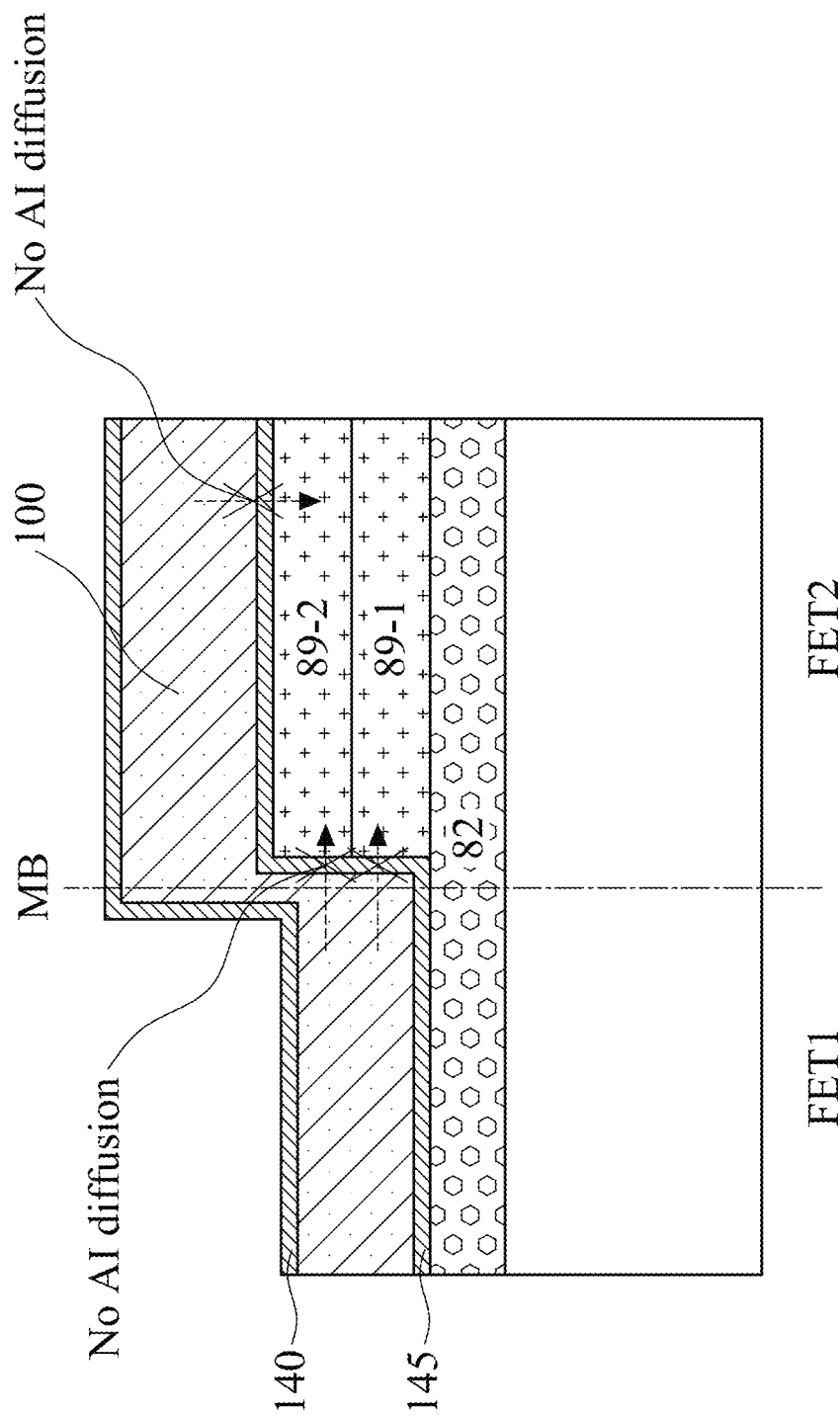
FIG. 11 shows a suppression of Al diffusion by a diffusion barrier layer according to embodiments of the present disclosure.

As set forth above, the Ti-rich layer of the first WFM layer 100 suppress Al diffusion from the WFM layer 100 to the underlying WFM layers 89 and the gate dielectric layer 82 and/or to the adjacent FETs, as shown in FIG. 11

Figure 12B:
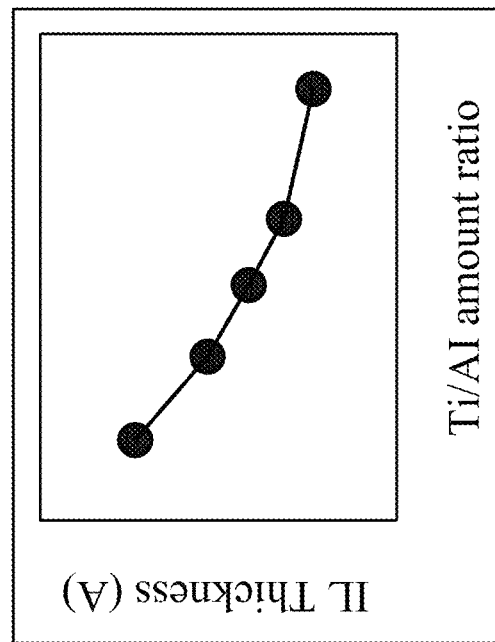
FIGS. 12A and 12B show thickness reduction effects of an interfacial layer according to embodiments of the present disclosure.
Figure 12A:
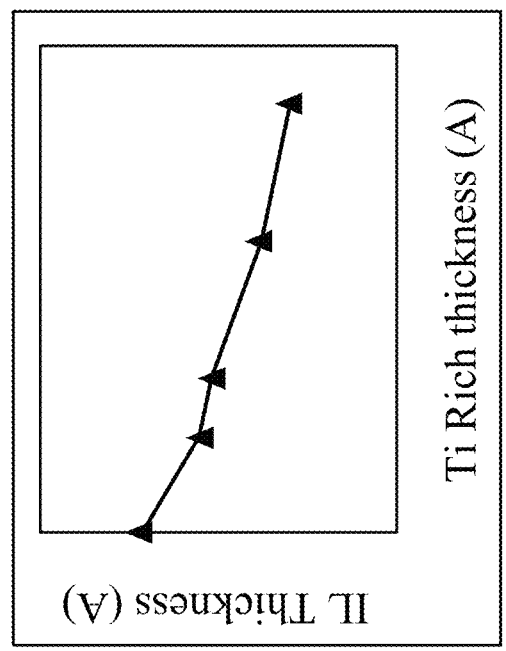

In addition, the use of the diffusion barrier layer can also reduce the thickness of the interfacial layer 81 by scavenging oxygen from the interfacial layer 81. FIGS. 12A and 12B show thickness reduction effects of an interfacial layer according to embodiments of the present disclosure.

As shown in FIGS. 12A and 12B, as the thickness of the diffusion barrier layer increases and/or the Ti/Al ratio or Ta amount or Si amount in the diffusion barrier layer increases, the thickness of the interfacial layer decreases, which improves device operational speed. In some embodiments, the thickness of the interfacial layer can be reduced to about 0.6 nm or less (more than zero).

It will be understood that not all advantages have been necessarily discussed herein, no particular advantage is required for all embodiments or examples, and other embodiments or examples may offer different advantages.

In accordance with one aspect of the present disclosure, a semiconductor device includes a gate structure disposed over a channel region and a source/drain region. The gate structure includes a gate dielectric layer over the channel region, one or more work function adjustment material layers over the gate dielectric layer, and a metal gate electrode layer over the one or more work function adjustment material layers. The one or more work function adjustment layers includes an aluminum containing layer, and a diffusion barrier layer is disposed at at least one of a bottom portion and a top portion of the aluminum containing layer, the diffusion barrier layer being one or more of a Ti-rich layer having a higher Ti concentration than a center of the aluminum containing layer, a Ti-doped layer, a Ta-rich layer having a higher Ta concentration than a center of the aluminum containing layer, a Ta-doped layer and a Si-doped layer. In one or more of the foregoing and following embodiments, the aluminum containing layer has work function of less than 4.4 eV and is made of one selected the group consisting of TaAl, TaAlC, TiAl and TiAlC. In one or more of the foregoing and following embodiments, a center portion of the aluminum containing layer has a lower Ta, Si or Ti concentration than the diffusion barrier layer. In one or more of the foregoing and following embodiments, a Ti, Ta or Si concentration of the diffusion barrier layer is in a range from 20 atomic % to 50 atomic %, and a Ti or Ta concentration of the center portion is in a range from 5 atomic % to 15 atomic %. In one or more of the foregoing and following embodiments, a Ti, Ta or Si concentration in the diffusion barrier layer gradually increases from a side on the center portion to a surface of the aluminum containing layer. In one or more of the foregoing and following embodiments, a Ta, Si or Ti concentration in the diffusion barrier layer is constant. In one or more of the foregoing and following embodiments, a Ta or Ti concentration in the center portion is constant. In one or more of the foregoing and following embodiments, an aluminum concentration of the aluminum containing layer is in a range from 10 atomic % to 30 atomic %. In one or more of the foregoing and following embodiments, a thickness of the center portion is in a range from 20% to 60% of a total thickness of the aluminum containing layer. In one or more of the foregoing and following embodiments, the one or more work function adjustment material layers includes a high work function material layer (with work function of more than 4.4 eV) including at least one of WN, WCN, W, Ru, TiN or TiSiN between the aluminum containing layer and the gate dielectric layer or between the aluminum containing layer and the glue layer.

In accordance with another aspect of the present disclosure, a complementary metal oxide semiconductor (CMOS) device includes a first field effect transistor (FET) including a first gate structure disposed over a first channel region and a second FET including a second gate structure disposed over a second channel region. The first FET is an n-type FET, and second FET is a p-type FET. The first gate structure includes, a gate dielectric layer, a first work function adjustment material layer over the gate dielectric layer, a glue and a metal gate electrode layer over the first work function adjustment material layer. The second gate structure includes a gate dielectric layer, a second work function adjustment material layer over the gate dielectric layer, the first work function adjustment material layer over the second work function adjustment material layer, the glue and the metal gate electrode layer over the first work function adjustment material layer. The metal gate electrode and the first work function adjustment material layer are continuous between the first FET and the second FET. The first work function adjustment layer includes aluminum (such as TiAl, TiAlC, TaAl or TaAlC), and the first work function adjustment layer further includes a diffusion barrier layer at at least one of a bottom portion and a top portion of the first work function adjustment layer, the diffusion barrier layer being one or more of a Ti-rich layer having a higher Ti concentration than a center of the first work function adjustment layer, a Ti-doped layer, a Ta-rich layer having a higher Ta concentration than a center of the first work function adjustment layer, a Ta-doped layer and a Si-doped layer.

In one or more of the foregoing and following embodiments, the second work function adjustment layer includes at least one of WCN, WN, W, Ru, TiN, TiCN and TiSiN. In one or more of the foregoing and following embodiments, the second work function adjustment layer include one or more layers made of WCN, WN, W, Ru, TiN, TiCN or TiSiN, and at least one of the one or more layers is discontinuous between the first FET and the second FET. In one or more of the foregoing and following embodiments, the first work function adjustment layer covers a top face and side face of the at least one of the one or more layers at a metal boundary of the first FET and the second FET. In one or more of the foregoing and following embodiments, the diffusion barrier layer is disposed at the bottom portion of the first work function adjustment layer. In one or more of the foregoing and following embodiments, the second work function adjustment material layer in second FET does not contain Al. In one or more of the foregoing and following embodiments, the first work function adjustment material layer further includes Ti, the diffusion barrier layer is a Ti-rich layer having a higher Ti concentration than a center of the first work function adjustment layer or a Ti-doped layer, a Ti concentration of the Ti-rich layer or the Ti-doped layer is in a range from 20 atomic % to 50 atomic %, and a Ti concentration of the center portion is in a range from 5 atomic % to 15 atomic %. In one or more of the foregoing and following embodiments, the first work function adjustment material layer is disposed directly on the gate dielectric layer. In one or more of the foregoing and following embodiments, a thickness of the center portion is in a range from 20% to 90% of a total thickness of the aluminum containing layer.

In accordance with another aspect of the present disclosure, in a method of manufacturing a semiconductor device, a gate dielectric layer is formed over a channel region made of a semiconductor material, a first work function adjustment layer is formed over the gate dielectric layer, and a metal gate electrode layer is formed over the first work function adjustment layer. The first work function adjustment layer includes aluminum, and the forming the first work function adjustment layer comprises forming a diffusion barrier layer at at least one of a bottom portion and a top portion of the first work function adjustment layer, the diffusion barrier layer being one or more of a Ti-rich layer having a higher Ti concentration than a center of the first work function adjustment layer, a Ti-doped layer, a Ta-rich layer having a higher Ta concentration than a center of the first work function adjustment layer, a Ta-doped layer and a Si-doped layer. In one or more of the foregoing and following embodiments, forming the Ti-rich layer or the Ti-doper layer includes gradually changing a source gas for at least one of aluminum and titanium during TiAl deposition or by introducing Ti source precursor during TaAl or TaAlC deposition. In one or more of the foregoing and following embodiments, forming the Ta-rich layer or the Ta-doped layer includes gradually changing a source gas for at least one of aluminum and tantalum during TaAl deposition or by introducing Ta source precursor during TiAl or TiAlC deposition. In one or more of the foregoing and following embodiments, forming the Si-doped layer includes introducing a third Si source precursor during the cyclic ALD deposition of TiAl, such as by doing cyclic pulse purge operation with Al based precursor, Si based precursor, Ti (or Ta) based precursor.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gate structure of a semiconductor device, comprising:
a gate dielectric layer disposed over a channel region;
one or more work function adjustment material layers over the gate dielectric layer; and
a metal gate electrode layer disposed over the one or more work function adjustment material layers,
wherein the one or more work function adjustment material layers include a first layer made of WCN and a second layer made of TiAl or TiAlC
a third layer containing Al and Ti is disposed at at least one of a bottom portion or a top portion of the second layer,
the third layer is a Ti-rich layer having a higher Ti concentration than a center of the second layer, and
a Ti concentration in the third layer increases from a side on the center portion to a surface of the second layer.

2. The gate structure of claim 1, wherein the second layer is made of TiAl.

3. The gate structure of claim 1, wherein the second layer is disposed over the first layer.

4. The gate structure of claim 1, wherein the third layer is disposed at the bottom portion of the second layer.

5. The gate structure of claim 1, wherein the third layer is disposed at the top portion of the second layer.

6. The gate structure of claim 1, wherein a Ti concentration of the third layer is in a range from 20 atomic % to 50 atomic %.

7. The gate structure of claim 6, wherein:
a Ti concentration of the center portion of the second layer is in a range from 5 atomic % to 15 atomic %.

8. The gate structure of claim 1, wherein an aluminum concentration of the second layer is in a range from 10 atomic % to 30 atomic %.

9. A semiconductor device, comprising:
a first field effect transistor (FET) including a first gate structure disposed over a first channel region; and
a second FET including a second gate structure disposed over a second channel region, wherein:
the first FET is an n-type FET, and second FET is a p-type FET,
the first gate structure includes:
a first gate dielectric layer;
a first work function adjustment material layer over the first gate dielectric layer;
a second work function adjustment material layer over the first work function adjustment material layer; and
a first metal gate electrode layer over the second work function adjustment material layer,
the second gate structure includes:
a second gate dielectric layer;
a third work function adjustment material layer over the second gate dielectric layer;
a fourth work function adjustment material layer over the third work function adjustment material layer; and
a second metal gate electrode layer over the fourth work function adjustment material layer,
the second and fourth work function adjustment material layers include TiAl or TiAlC, and include a diffusion barrier layer containing Al and Ti at a bottom portion of the second and fourth work function adjustment material layers, respectively,
the diffusion barrier layer is a Ti-rich layer having a higher Ti concentration than a center portion of the second and fourth work function adjustment material layers, and
a Ti concentration in the diffusion barrier layer increases from a side on the center portion to a surface of the second and fourth work function adjustment material layers.

10. The semiconductor device of claim 9, wherein:
the first work function adjustment material layer and the third work function adjustment material layer are continuously formed between the first FET and the second FET, and
a step is formed at a boundary of the first work function adjustment material layer and the third work function adjustment material layer.

11. The semiconductor device of claim 9, wherein the first and third work function adjustment material layers include at least one of WN, WCN, or Ru.

12. The semiconductor device of claim 9, wherein the first gate and the second gate are continuously formed between the first FET and the second FET.

13. The semiconductor device of claim 9, further comprising a third FET including a third gate structure disposed over a third channel region, wherein:
the third gate structure includes:
a third gate dielectric layer;
a fifth work function adjustment material layer over the third gate dielectric layer;
a sixth work function adjustment material layer over the fifth work function adjustment material layer; and
a third metal gate electrode layer over the sixth work function adjustment material layer,
the fifth work function adjustment material layer is made of a same material as the first work function adjustment material layer,
the sixth work function adjustment material layer is made of a same material as the second work function adjustment material layer, and
a thickness of the third work function adjustment material layer is different from a thickness of the fifth work function adjustment material layer.

14. The semiconductor device of claim 13, wherein the first gate dielectric layer, the second gate dielectric layer and the third gate dielectric layer are made of different material from each other.

15. The semiconductor device of claim 14, wherein the first gate dielectric layer, the second gate dielectric layer and the third gate dielectric layer are composed of a high-k dielectric with a different concentration of rare-earth metal.

16. The semiconductor device of claim 9, further comprising a third FET including a third gate structure disposed over a third channel region, wherein:
the third gate structure includes:
a third gate dielectric layer;
a sixth work function adjustment material layer over the third gate dielectric layer; and
a third metal gate electrode layer over the sixth work function adjustment material layer,
the sixth work function adjustment material layer is made of a same material as the second work function adjustment material layer.

17. A method of manufacturing a semiconductor device, comprising:
forming a gate dielectric layer over a channel region made of a semiconductor material;
forming a first work function adjustment layer over the gate dielectric layer; and
forming a metal gate electrode layer over the first work function adjustment layer, wherein:
the first work function adjustment layer includes aluminum and titanium,
the forming the first work function adjustment layer comprises forming a Ti-rich diffusion barrier layer at at least one of a bottom portion and a top portion of the first work function adjustment layer, and
a Ti concentration in the diffusion barrier layer increases from a side on the center portion to a surface of the first work function adjustment material layer.

18. The method of claim 17, wherein the diffusion barrier layer is formed by gradually changing a source gas for at least one of aluminum and titanium.

19. The method of claim 17, wherein the first work function adjustment material layer includes TiAl or TiAlC.

20. The method of claim 17, further comprising a second work function adjustment layer between the first work function adjustment layer and the gate dielectric layer.

* * * * *